United States Patent
Murakami et al.

(10) Patent No.: US 10,308,557 B2
(45) Date of Patent: Jun. 4, 2019

(54) PIEZOELECTRIC MATERIAL, PIEZOELECTRIC ELEMENT, AND ELECTRONIC EQUIPMENT

(71) Applicant: CANON KABUSHIKI KAISHA, Tokyo (JP)

(72) Inventors: Shunsuke Murakami, Kawasaki (JP); Takayuki Watanabe, Yokohama (JP); Miki Ueda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 317 days.

(21) Appl. No.: 14/764,081

(22) PCT Filed: Jan. 24, 2014

(86) PCT No.: PCT/JP2014/052188
§ 371 (c)(1),
(2) Date: Jul. 28, 2015

(87) PCT Pub. No.: WO2014/119705
PCT Pub. Date: Aug. 7, 2014

(65) Prior Publication Data
US 2015/0368161 A1 Dec. 24, 2015

(30) Foreign Application Priority Data
Jan. 29, 2013 (JP) .................. 2013-014615

(51) Int. Cl.
*H01L 41/187* (2006.01)
*C04B 35/495* (2006.01)
(Continued)

(52) U.S. Cl.
CPC .............. *C04B 35/495* (2013.01); *B06B 1/06* (2013.01); *B32B 18/00* (2013.01);
(Continued)

(58) Field of Classification Search
CPC .................................................. H01L 41/1873
See application file for complete search history.

(56) References Cited

U.S. PATENT DOCUMENTS

| 8,172,372 B2* | 5/2012 | Fujii | ................... B41J 2/14233 310/334 |
| 2004/0129919 A1* | 7/2004 | Horikawa | ............ C04B 35/493 252/62.9 PZ |

(Continued)

FOREIGN PATENT DOCUMENTS

| EP | 1876156 A1 | 1/2008 |
| JP | 2002-047064 A | 2/2002 |

(Continued)

OTHER PUBLICATIONS

Zhu. Effects of CuO dopping on properties of NaNbO3-BaTiO3 lead-free piezoelectric ceramics (Abstract). Kuei Suan Jen Hsueh Pao/Journal of the Chinese Ceramic Society | Year: 2010 | vol. 38 | Issue: 6.*

(Continued)

*Primary Examiner* — Matthew E. Hoban
(74) *Attorney, Agent, or Firm* — Canon U.S.A. Inc., IP Division

(57) ABSTRACT

There are provided a lead- and potassium-free piezoelectric material that has a high Curie temperature and a high mechanical quality factor and is stable in long-term driving and a piezoelectric element including the lead- and potassium-free piezoelectric material. A piezoelectric material containing a perovskite-type metal oxide having the general formula (1): $Na_xBa_{1-y}Nb_yZr_{1-y}O_3$ wherein x satisfies $0.85 \leq x \leq 0.96$ and y satisfies $0.90 \leq y \leq 0.96$ and a piezoelectric element including the piezoelectric material. The piezoelectric material may include the perovskite-type metal oxide (Continued)

and Cu, and the Cu content corresponds to 2.00 mol % or less of the amount of the perovskite-type metal oxide.

26 Claims, 14 Drawing Sheets

(51) Int. Cl.
| | |
|---|---|
| B41J 2/14 | (2006.01) |
| H01L 41/43 | (2013.01) |
| H01L 41/09 | (2006.01) |
| H02N 2/10 | (2006.01) |
| H02N 2/16 | (2006.01) |
| B32B 18/00 | (2006.01) |
| C04B 35/626 | (2006.01) |
| B06B 1/06 | (2006.01) |
| G02B 7/09 | (2006.01) |
| G02B 27/00 | (2006.01) |
| H01L 41/047 | (2006.01) |
| H01L 41/083 | (2006.01) |
| H01L 41/18 | (2006.01) |
| H02N 2/00 | (2006.01) |
| H04N 5/217 | (2011.01) |

(52) U.S. Cl.
CPC ....... *B41J 2/14201* (2013.01); *B41J 2/14233* (2013.01); *C04B 35/62675* (2013.01); *G02B 7/09* (2013.01); *G02B 27/0006* (2013.01); *H01L 41/0471* (2013.01); *H01L 41/083* (2013.01); *H01L 41/0973* (2013.01); *H01L 41/18* (2013.01); *H01L 41/1873* (2013.01); *H01L 41/43* (2013.01); *H02N 2/001* (2013.01); *H02N 2/106* (2013.01); *H02N 2/163* (2013.01); *H04N 5/2171* (2013.01); *B41J 2202/03* (2013.01); *C04B 2235/3201* (2013.01); *C04B 2235/3215* (2013.01); *C04B 2235/3236* (2013.01); *C04B 2235/3248* (2013.01); *C04B 2235/3255* (2013.01); *C04B 2235/3281* (2013.01); *C04B 2235/768* (2013.01); *C04B 2235/77* (2013.01); *C04B 2235/785* (2013.01); *C04B 2235/786* (2013.01); *C04B 2235/96* (2013.01); *C04B 2237/345* (2013.01); *C04B 2237/704* (2013.01)

(56) References Cited

U.S. PATENT DOCUMENTS

| | | | | |
|---|---|---|---|---|
| 2004/0178703 | A1* | 9/2004 | Senoo | H01L 41/0471 310/363 |
| 2007/0103554 | A1* | 5/2007 | Kaihara | G02B 27/0006 348/207.99 |
| 2007/0216264 | A1 | 9/2007 | Furukawa | |
| 2008/0061263 | A1 | 3/2008 | Kawada | |
| 2014/0049138 | A1* | 2/2014 | Shiraki | C04B 35/495 310/330 |

FOREIGN PATENT DOCUMENTS

| | | | |
|---|---|---|---|
| JP | 2009-242166 A | | 10/2009 |
| JP | 2011-213580 A | | 10/2011 |
| JP | 2012-195577 A | | 10/2012 |
| KR | 20070093138 | * | 4/2005 |
| WO | 2012/118213 A1 | | 9/2012 |
| WO | 2012/141105 A1 | | 10/2012 |
| WO | WO20121141105 | * | 10/2012 |
| WO | 2013/005701 A1 | | 1/2013 |

OTHER PUBLICATIONS

Kim. Leakage Current Characteristics of Lead-Free K0:5Na0:5NbO3 Ferroelectric Thin Films with (K,Na) Excess and Li Substitution. Japanese Journal of Applied Physics 49 (2010) 095805.*

Zeng et al., "Ferroelectric and Piezoelectric Properties of Na1-xBaxNb1-xTixO3 Ceramics", Journal of the American Ceramic Society, 2006, vol. 89, pp. 2828 to 2832.

* cited by examiner

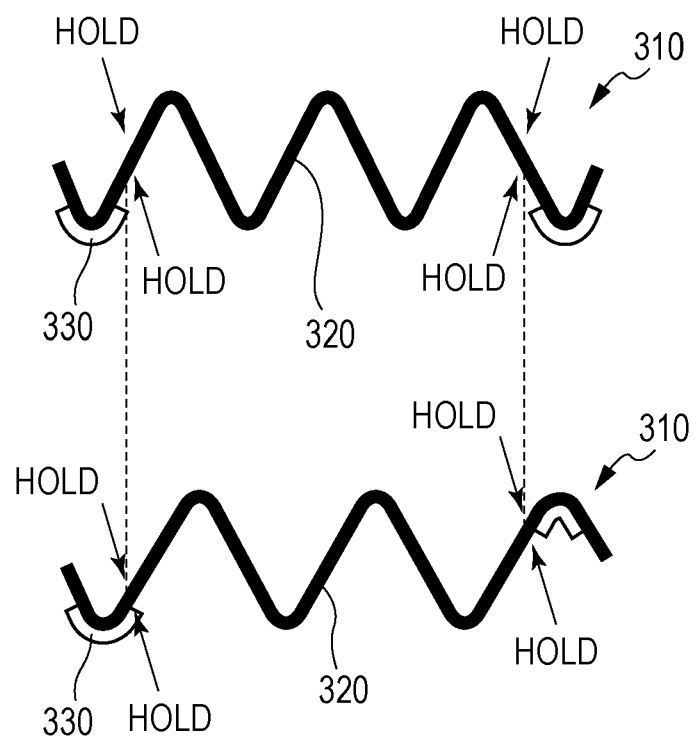

PIEZOELECTRIC MATERIAL, PIEZOELECTRIC ELEMENT, AND ELECTRONIC EQUIPMENT

TECHNICAL FIELD

The present invention relates to a piezoelectric material and more particularly to a lead-free piezoelectric material. The present invention also relates to a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

BACKGROUND ART

Lead zirconate titanate is a typical piezoelectric material and is used in various piezoelectric devices, such as actuators, oscillators, sensors, and filters. However, it has been pointed out that when lead-containing piezoelectric devices are scrapped and exposed to acid rain, lead components may leach from the piezoelectric materials into the ground and harm an ecosystem. Thus, lead-free piezoelectric materials for lead-free piezoelectric devices are being actively studied and developed.

NPL 1 discloses that, in a solid solution of a small amount of barium titanate in an antiferroelectric substance sodium niobate, sodium niobate converts into a ferroelectric substance. The sodium niobate material described in NPL 1 is free of lead and potassium. Potassium is responsible for poor sinterability and low moisture resistance. The material described in NPL 1 has a barium titanate concentration in the range of 5% to 20% and is sintered at a temperature in the range of 1200° C. to 1280° C. The Curie temperature of the sodium niobate material described in NPL 1 is higher than the Curie temperature (120° C. to 130° C.) of a typical lead-free piezoelectric material barium titanate. For example, it is disclosed that $(Na_{0.9}Ba_{0.1})(Nb_{0.9}Ti_{0.1})O_3$ has a Curie temperature of 230° C. However, this composition has a mechanical quality factor as low as 140.

CITATION LIST

Non Patent Literature

NPL 1 J. T. Zeng et al., Journal of the American Ceramic Society, 2006, vol. 89, pp. 2828-2832

SUMMARY OF INVENTION

Technical Problem

Known sodium niobate piezoelectric materials have problems of a low mechanical quality factor and low stability in long-term driving. The mechanical quality factor relates to resonant driving.

The present invention solves such problems and provides a lead- and potassium-free piezoelectric material that has a high Curie temperature and a high mechanical quality factor and is stable in long-term driving. The present invention also provides a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

Solution to Problem

A piezoelectric material according to one aspect of the present invention that solves the problems described above is a piezoelectric material containing a perovskite-type metal oxide having the following general formula (1):

$$Na_xBa_{1-y}Nb_yZr_{1-y}O_3 \qquad (1)$$

wherein x satisfies 0.85≤x≤0.96, and y satisfies 0.90≤y≤0.96.

A piezoelectric element according to one aspect of the present invention includes a first electrode, a piezoelectric material portion, and a second electrode, wherein the piezoelectric material portion includes the piezoelectric material described above.

A multilayered piezoelectric element according to one aspect of the present invention includes piezoelectric material layers and electrode layers alternately stacked on top of one another. The electrode layers include an internal electrode. The piezoelectric material layers include the piezoelectric material described above.

A liquid discharge head according to one aspect of the present invention includes a liquid chamber and a discharge port in communication with the liquid chamber. The liquid chamber includes a vibrating portion that includes the piezoelectric element or the multilayered piezoelectric element described above.

A liquid discharge apparatus according to one aspect of the present invention includes a mounting portion for a transfer medium and the liquid discharge head described above.

An ultrasonic motor according to one aspect of the present invention includes a vibrating member and a moving body in contact with the vibrating member. The vibrating member includes the piezoelectric element or the multilayered piezoelectric element described above.

An optical apparatus according to one aspect of the present invention includes a drive unit that includes the ultrasonic motor described above.

A vibratory apparatus according to one aspect of the present invention includes a vibrating member that includes the piezoelectric element or the multilayered piezoelectric element described above.

A dust removing device according to one aspect of the present invention includes a vibrating portion that includes the vibratory apparatus described above.

An image pickup apparatus according to one aspect of the present invention includes the dust removing device and an image pickup element unit, wherein the dust removing device includes a vibrating member on a light-receiving surface side of the image pickup element unit.

Electronic equipment according to one aspect of the present invention includes a piezoelectric acoustic component that includes the piezoelectric element or the multilayered piezoelectric element described above.

Advantageous Effects of Invention

The present invention provides a lead- and potassium-free piezoelectric material that has a high Curie temperature and a high mechanical quality factor and is stable in long-term driving. The present invention also provides a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the lead-free piezoelectric material.

A piezoelectric material according to an embodiment of the present invention contains no lead and has a low environmental load.

BRIEF DESCRIPTION OF DRAWINGS

FIGS. 11A and 11B are schematic views illustrating the vibration principle of a dust removing device according to an embodiment of the present invention.

DESCRIPTION OF EMBODIMENTS

Figure 1:
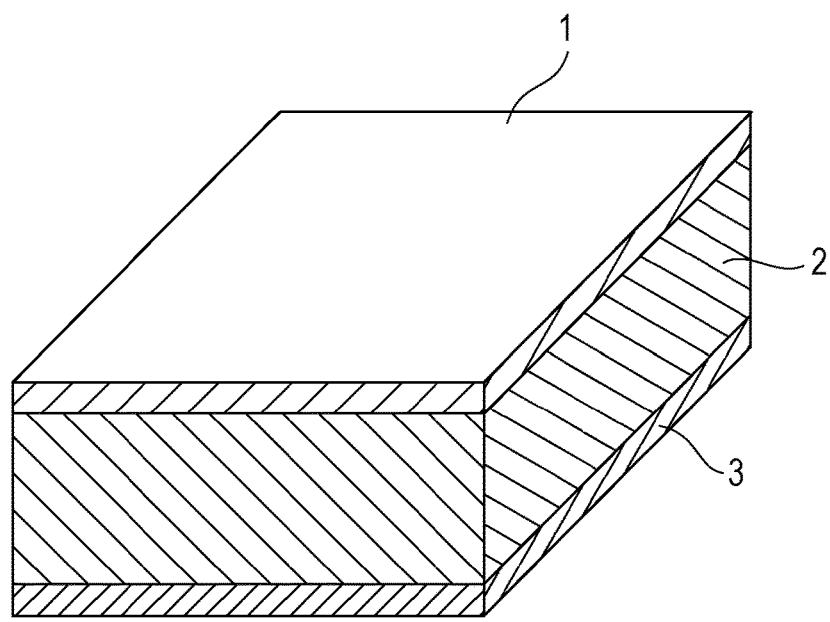
FIG. 1 is a schematic view of a piezoelectric element according to an embodiment of the present invention.

Embodiments of the present invention will be described below.

The present invention provides a lead-free piezoelectric material that is based on $NaNbO_3$ and $BaZrO_3$ and has a high mechanical quality factor. Utilizing its dielectric characteristics, a piezoelectric material according to an embodiment of the present invention can be used in various applications, such as capacitors, memories, and sensors.

A piezoelectric material according to an embodiment of the present invention includes a perovskite-type metal oxide having the following general formula (1):

$$Na_xBa_{1-y}Nb_yZr_{1-y}O_3 \qquad (1)$$

wherein x satisfies $0.85 \leq x \leq 0.96$, and y satisfies $0.90 \leq y \leq 0.96$.

The term "perovskite-type metal oxide", as used herein, refers to a metal oxide having a perovskite-type structure, which is ideally a cubic structure, as described in Iwanami Rikagaku Jiten, 5th edition (Iwanami Shoten, published on Feb. 20, 1998). A metal oxide having a perovskite-type structure is generally represented by the chemical formula $ABO_3$. In a perovskite-type metal oxide, elements A and B in the form of ions occupy particular positions of a unit cell referred to as the A site and the B site, respectively. For a cubic unit cell, the element A occupies the vertexes of the cube, and the element B occupies the body-centered position of the cube. The element O as an oxygen anion occupies the face-centered positions of the cube.

In the perovskite-type metal oxide having the general formula (1), the metallic elements at the A site are Na and Ba, and the metallic elements at the B site are Nb and Zr. Na and Ba may partly occupy the B site. Likewise, Nb and Zr may partly occupy the A site.

In the general formula (1), although the molar ratio of the B site element to the element O is 1:3, small variations in the molar ratio (for example, 1.00:2.94 to 1.00:3.06) are within the scope of the present invention, provided that the metal oxide has the perovskite-type structure as the primary phase. The perovskite-type structure of the metal oxide can be determined by structural analysis using X-ray diffraction or electron diffraction.

A piezoelectric material according to an embodiment of the present invention may have any form, such as a ceramic, powder, single crystal, membrane, or slurry, and may be a ceramic. The term "ceramic", as used herein, refers to an aggregate of crystal grains (also referred to as a bulk), that is, a polycrystalline material, containing a metal oxide as the base component and sintered by heat treatment. The term "ceramic" also includes a ceramic processed after sintering.

The value x of the general formula (1), which represents the amount of Na at the A site, may be in the range of $0.85 \leq x \leq 0.96$. A value x of less than 0.85 results in the deficiency of Na relative to the sum of Nb and Zr and the occurrence of an impurity phase (such as $Ba_4Nb_2O_9$). Metal oxide samples rich in such an impurity phase have a low resistivity in the range of $10^7$ to $10^8$ Ω·cm and are difficult to polarize. A value x of more than 0.96 results in low piezoelectricity. When x satisfies $0.85 \leq x \leq 0.96$, preferably $0.90 \leq x \leq 0.95$, the impurity phase rarely occurs, and the piezoelectric material has a high mechanical quality factor.

The value y of the general formula (1), which represents the amount of Nb at the B site, may be in the range of $0.90 \leq y \leq 0.96$. A value y of less than 0.90 results in a Curie temperature of less than 140° C. At a value y of more than 0.96 the perovskite-type metal oxide is paraelectric and has no piezoelectricity. Thus, a value y in the range of $0.90 \leq y \leq 0.96$ results in a Curie temperature of 170° C. or more and a high mechanical quality factor.

A value y in the range of $0.90 \leq y \leq 0.96$ results in a Curie temperature in the range of approximately 170° C. to 300° C. and a mechanical quality factor of more than 400. A value y in the range of $0.94 \leq y \leq 0.96$ results in a Curie temperature in the range of approximately 230° C. to 300° C., a mechanical quality factor of more than 600, and a coercive field of more than 30 kV/cm, and therefore the piezoelectric material is stable in long-term driving.

The Curie temperature is the temperature above which the piezoelectricity of a piezoelectric material disappears. The term "Curie temperature", as used herein, refers to a temperature at which the dielectric constant is highest in the vicinity of the phase transition temperature between a ferroelectric phase and a paraelectric phase.

A piezoelectric material according to an embodiment of the present invention may contain the perovskite-type metal oxide and Cu in order to increase its resistivity, mechanical quality factor, Young's modulus, and density. The Cu content may be 2.00 mol % or less of the amount of the perovskite-type metal oxide. When the Cu content corresponds to more than 2.00 mol % of the amount of the perovskite-type metal oxide, this may result in the occurrence of an impurity phase and low piezoelectricity. The Cu content expressed in mol % is the molar ratio of Cu on a metal basis. Cu may be present at the A site (in 12-fold coordination), the B site (in 6-fold coordination), or both of the perovskite structure or may be present at grain boundaries of the ceramic.

Sintering of crystals containing sodium niobate as a component may cause the evaporation or diffusion of Na, and the sample composition after sintering may lack Na relative to Nb. Thus, the A site has defects. However, weighing an excessive amount of Na raw powder may result in a poor insulation property of the sintered body. Thus, part of added Cu may compensate for the defects on the A site. The raw materials may be weighed such that the Na deficiency is not more than 5% relative to Nb in the composition after firing, and Cu may be added to the raw materials.

Cu is not necessarily present at the A or B site and may be present at grain boundaries. Because of its low melting point, Cu promotes liquid phase sintering. Thus, Cu may segregate at grain boundaries. Acceleration of liquid phase sintering reduces the number of pores in the sintered body and increases the density of the sintered body. Reduction in the number of pores results in an increased mechanical quality factor or an increased Young's modulus. The distribution of Cu in a sample and the occupation site in a crystal can be determined with an electron microscope, by energy dispersive X-ray spectroscopy, by X-ray diffraction, by Raman scattering, or with a transmission electron microscope.

A piezoelectric material according to an embodiment of the present invention may satisfy x<y in the general formula (1). Under the condition of x<y, Cu is taken in the crystal lattice and increases the resistivity, mechanical quality factor, Young's modulus, and density. The starting materials may have such a composition that x is smaller than y. When x is greater than or equal to y, the sample may have a poor insulation property.

In order to facilitate the production of a piezoelectric material according to an embodiment of the present invention or modify the physical properties of a piezoelectric material according to an embodiment of the present invention, barium may be partly substituted by a divalent metallic element; for example, 20 mol % or less of barium may be substituted by strontium or calcium. Likewise, niobium may be partly substituted by a pentavalent metallic element; for example, 20 mol % or less of niobium may be substituted by tantalum or vanadium.

In order to form a sintered body of a piezoelectric material according to an embodiment of the present invention, it is necessary to prepare a green compact. The green compact is a shaped solid of the raw powder. The raw powder may be of high purity. The compact can be formed by uniaxial pressing, cold hydrostatic pressing, hot hydrostatic pressing, casting, or extrusion molding. The compact may be formed from a granulated powder. Sintering of the compact formed from a granulated powder has an advantage that the grain size distribution of the sintered body tends to become uniform.

The raw material powder of a piezoelectric material may be granulated by any method. Spray drying can make the particle size of the granulated powder more uniform. A binder for use in granulation may be poly(vinyl alcohol) (PVA), poly(vinyl butyral) (PVB), or an acrylic resin. The amount of binder is preferably in the range of 1 to 10 parts by weight per 100 parts by weight of the raw material powder of the piezoelectric material, more preferably 2 to 5 parts by weight in order to increase the compact density.

The compact may be sintered by any method. Examples of the sintering method include sintering in an electric furnace, sintering in a gas furnace, electric heating, microwave sintering, millimeter-wave sintering, and hot isostatic pressing (HIP). Sintering in an electric furnace or a gas furnace may be performed in a continuous furnace or a batch furnace.

The sintering temperature is not particularly limited and may be such that the compounds can react and grow sufficiently as crystals. The sintering temperature is preferably 1100° C. or more and 1400° C. or less, more preferably 1150° C. or more and 1300° C. or less, such that the average grain size is in the range of 10 to 50 μm. In order to ensure the reproducibility and stability of the characteristics of a piezoelectric material produced by sintering, sintering may be performed at a constant temperature within a desired temperature range for 2 hours or more and 48 hours or less. Although two-step sintering may also be performed, a sintering method without an abrupt temperature change can improve productivity.

A piezoelectric material produced by sintering may be polished and then heat-treated at the Curie temperature or higher. Heat treatment of the piezoelectric material at the Curie temperature or higher can relieve the residual stress of the piezoelectric material resulting from mechanically polishing and thereby improves the piezoelectric property of the piezoelectric material. The heat-treatment time may be, but is not limited to, one hour or more.

A piezoelectric material according to an embodiment of the present invention having a crystal grain size of more than 100 μm may have an insufficient strength in a cutting process and a polishing process. A grain size of less than 0.3 μm results in low piezoelectricity. Thus, the average grain size is preferably 0.3 μm or more and 100 μm or less, more preferably 0.5 μm or more and 60 μm or less.

The term "grain size", as used herein, refers to a "projected area equivalent circular diameter" generally referred to in microscopy and refers to the diameter of a perfect circle having the same area as the projected area of a crystal grain. In the present invention, the grain size may be determined by any method. For example, the grain size may be determined by the image processing of an image of a surface of the piezoelectric material taken with a polarizing microscope or a scanning electron microscope. Since the optimum magnification depends on the grain size to be measured, an optical microscope or an electron microscope may be selected in accordance with the grain size. The equivalent circular diameter may be determined from an image of a polished surface or a cross section rather than the surface of the material.

It is desirable that when a piezoelectric material according to an embodiment of the present invention is used as a film formed on a substrate, the thickness of the piezoelectric material film be 200 nm or more and 10 μm or less, more preferably 300 nm or more and 3 μm or less. This is because when the thickness of the piezoelectric material film is 200 nm or more and 10 μm or less the piezoelectric element has a sufficient electromechanical conversion function.

The film may be formed by any method, for example, a chemical solution deposition method (a CSD method), a sol-gel method, a metal-organic chemical vapor deposition method (a MOCVD method), a sputtering method, a pulsed laser deposition method (a PLD method), a hydrothermal synthesis method, or an aerosol deposition method (an AD method). The film may be formed by a chemical solution deposition method or a sputtering method. The area of the film can easily be increased using the chemical solution deposition method or the sputtering method. The substrate used for a piezoelectric material according to an embodiment of the present invention may be a single-crystal substrate having a polished (001) or (110) section. Use of such a single-crystal substrate having a particular polished crystal face allows the piezoelectric material film formed on the substrate surface to be strongly oriented in the same direction.

(Piezoelectric Element)

A piezoelectric element manufactured using a piezoelectric material according to an embodiment of the present invention will be described below.

FIG. 1 is a schematic view of a piezoelectric element according to an embodiment of the present invention. The piezoelectric element includes a first electrode 1, a piezoelectric material portion 2, and a second electrode 3. The piezoelectric material of the piezoelectric material portion 2 is a piezoelectric material according to an embodiment of the present invention.

The piezoelectric property of the piezoelectric material can be evaluated by at least attaching the first electrode 1 and the second electrode 3 to the piezoelectric material portion 2 to form the piezoelectric element. Each of the first electrode 1 and the second electrode 3 is an electrically conductive layer having a thickness in the range of approximately 5 nm to 10 μm. The material of each of the electrodes is not particularly limited and may be any material that is commonly used for piezoelectric elements. Examples of such a material include metals, such as Ti, Pt, Ta, Ir, Sr, In, Sn, Au, Al, Fe, Cr, Ni, Pd, Ag, and Cu, and compounds thereof.

Each of the first electrode 1 and the second electrode 3 may be made of one of these materials or may be a multilayer film made of two or more of the materials. The material(s) of the first electrode 1 may be different from the material(s) of the second electrode 3.

The first electrode 1 and the second electrode 3 may be manufactured by any method, for example, by baking a metal paste or using a sputtering process or a vapor deposition method. The first electrode 1 and the second electrode 3 may have a desired pattern.

The piezoelectric element may have a unidirectional polarization axis. Having the unidirectional polarization axis can increase the piezoelectric constant of the piezoelectric element.

The polarization method for the piezoelectric element is not particularly limited. Polarization treatment may be performed in the ambient atmosphere or in an oil. The polarization temperature may be in the range of 60° C. to 160° C. The optimum conditions for polarization may vary with the composition of the piezoelectric material of the piezoelectric element. The electric field for the polarization treatment may be greater than or equal to the coercive field of the material and more specifically may be in the range of 1 to 5 kV/mm.

The piezoelectric constant and the mechanical quality factor of the piezoelectric element can be calculated from the resonance frequency and the antiresonant frequency measured with a commercially available impedance analyzer in accordance with a standard of Japan Electronics and Information Technology Industries Association (JEITA EM-4501). This method is hereinafter referred to as a resonance-antiresonance method.

(Multilayered Piezoelectric Element)

A multilayered piezoelectric element manufactured using a piezoelectric material according to an embodiment of the present invention will be described below.

A multilayered piezoelectric element according to an embodiment of the present invention includes piezoelectric material layers and electrode layers alternately stacked on top of one another. The electrode layers include an internal electrode. The piezoelectric material layers are formed of a piezoelectric material according to an embodiment of the present invention.

Figure 2A:
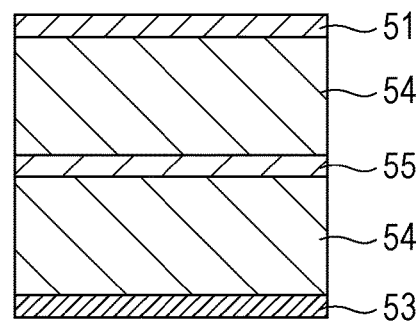
FIGS. 2A and 2B are schematic cross-sectional views of a multilayered piezoelectric element according to an embodiment of the present invention.
Figure 2B:
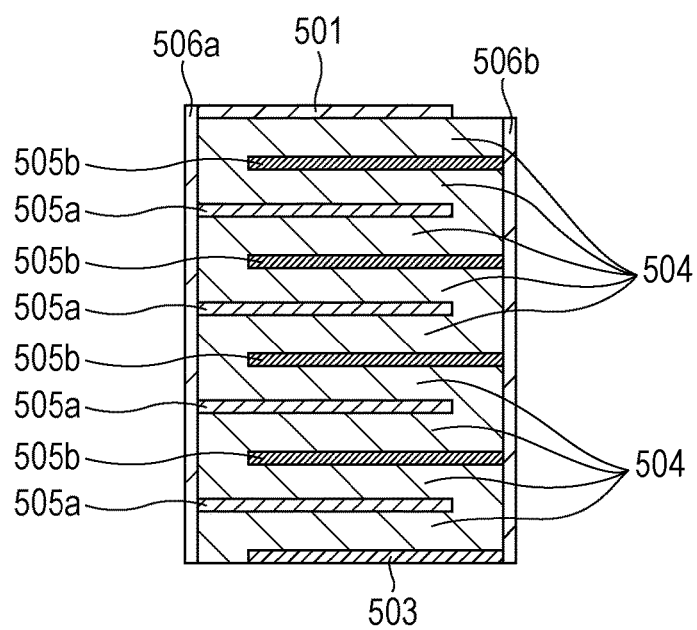

FIGS. 2A and 2B are schematic cross-sectional views of a multilayered piezoelectric element according to an embodiment of the present invention. A multilayered piezoelectric element according to an embodiment of the present invention includes piezoelectric material layers 54 and electrodes including an internal electrode 55. The multilayered piezoelectric element includes the piezoelectric material layers 54 and the layered electrodes alternately stacked on top of one another. The piezoelectric material layers 54 are formed of the piezoelectric material described above. The electrodes may include external electrodes, such as a first electrode 51 and a second electrode 53, as well as the internal electrode 55.

FIG. 2A illustrates a multilayered piezoelectric element according to an embodiment of the present invention that includes a layered body 56 between the first electrode 51 and the second electrode 53, wherein the layered body includes two piezoelectric material layers 54 with one internal electrode 55 interposed therebetween. The number of piezoelectric material layers and the number of internal electrodes are not particularly limited and may be increased, as illustrated in FIG. 2B. The multilayered piezoelectric element illustrated in FIG. 2B includes a layered body between a first electrode 501 and a second electrode 503. The layered body includes nine piezoelectric material layers 504 and eight internal electrodes 505 (505a and 505b) alternately stacked on top of one another. The multilayered piezoelectric element further includes an external electrode 506a and an external electrode 506b for connecting the internal electrodes to each other.

The size and shape of the internal electrodes 55 and 505 and the external electrodes 506a and 506b may be different from the size and shape of the piezoelectric material layers 54 and 504. Each of the internal electrodes 55 and 505 and the external electrodes 506a and 506b may be composed of a plurality of portions.

Each of the internal electrodes 55 and 505, the external electrodes 506a and 506b, the first electrodes 51 and 501, and the second electrodes 53 and 503 is an electrically conductive layer having a thickness in the range of approximately 5 nm to 10 μm. The material of each of the electrodes is not particularly limited and may be any material that is commonly used for piezoelectric elements. Examples of such a material include metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be made of one of these materials or a mixture or an alloy thereof or may be a multilayer film made of two or more of the materials. These electrodes may be made of different materials. The internal electrodes 55 and 505 may contain at least one of Ni and Cu, which are inexpensive electrode materials. When the internal electrodes 55 and 505 contain at least one of Ni and Cu, the multilayered piezoelectric element may be baked in a reducing atmosphere.

The internal electrode 55 and the internal electrodes 505 of the multilayered piezoelectric element may contain Ag and Pd. The weight ratio M1/M2 of the weight M1 of Ag to the weight M2 of Pd is preferably in the range of $1.5 \leq M1/M2 \leq 9.0$, more preferably $2.3 \leq M1/M2 \leq 4.0$. A weight ratio M1/M2 of less than 1.5 is undesirable because of a high sintering temperature of the internal electrode(s). A weight ratio M1/M2 of more than 9.0 is also undesirable because the internal electrode(s) has an island structure and a heterogeneous surface.

As illustrated in FIG. 2B, the plurality of electrodes including the internal electrodes 505 may be connected to each other in order to synchronize the driving voltage phases. For example, the internal electrodes 505a may be connected to the first electrode 501 through the external electrode 506a. The internal electrodes 505b may be connected to the second electrode 503 through the external electrode 506b. The electrodes may be connected by any method. For example, an electrode or an electric wire for connection may be disposed on a side surface of the multilayered piezoelectric element. Alternatively, a through-hole passing through the piezoelectric material layers 504 may be formed, and the inside of the through-hole may be coated with an electrically conductive material to connect the electrodes.

(Liquid Discharge Head)

A liquid discharge head according to an embodiment of the present invention includes a liquid chamber and a discharge port in communication with the liquid chamber. The liquid chamber includes a vibrating portion that includes a piezoelectric element or a multilayered piezoelectric element according to an embodiment of the present invention. A liquid to be discharged from a liquid discharge head according to an embodiment of the present invention may be any fluid, for example, an aqueous liquid or a nonaqueous liquid, such as water, an ink, or a fuel.

Figure 3A:
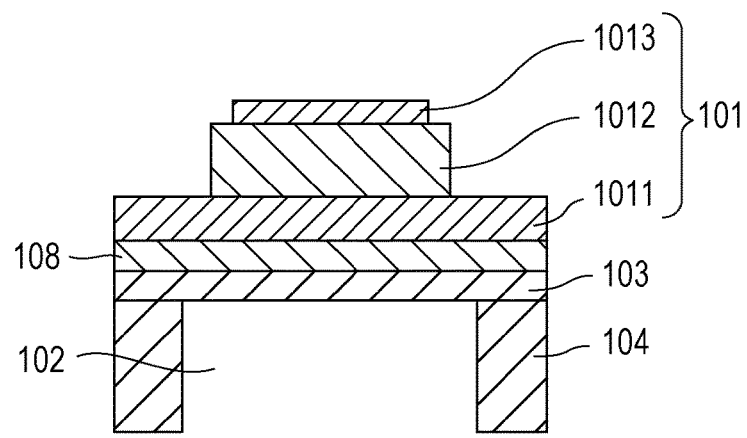
FIGS. 3A and 3B are schematic views of a liquid discharge head according to an embodiment of the present invention.
Figure 3B:
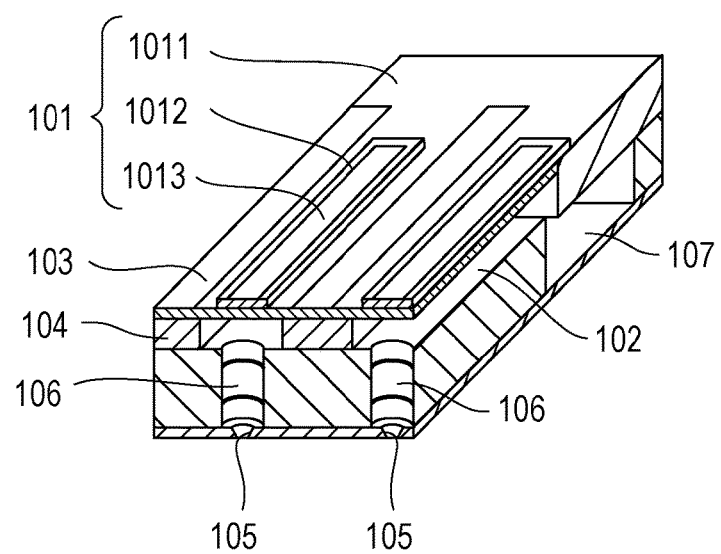

FIGS. 3A and 3B are schematic views of a liquid discharge head according to an embodiment of the present invention. As illustrated in FIGS. 3A and 3B, the liquid discharge head includes a piezoelectric element 101 according to an embodiment of the present invention. The piezoelectric element 101 includes a first electrode 1011, a piezoelectric material 1012, and a second electrode 1013. The piezoelectric material 1012 may be patterned, as illustrated in FIG. 3B.

FIG. 3B is a schematic view of the liquid discharge head. The liquid discharge head includes a discharge port 105, an individual liquid chamber 102, a communicating hole 106 that connects the individual liquid chamber 102 to the discharge port 105, a liquid chamber partition wall 104, a common liquid chamber 107, a diaphragm 103, and the piezoelectric element 101. Although the piezoelectric element 101 is rectangular in FIG. 3B, the piezoelectric element 101 may be of another shape, such as elliptical, circular, or parallelogrammic. In general, the piezoelectric material 1012 has a shape corresponding to the shape of the individual liquid chamber 102.

The piezoelectric element 101 of the liquid discharge head will be described in detail below with reference to FIG. 3A. FIG. 3A is a cross-sectional view of FIG. 3B in the width direction of the piezoelectric element. Although the piezoelectric element 101 has a rectangular cross section in FIG. 3A, the piezoelectric element 101 may have a trapezoidal or inverted trapezoidal cross section.

In FIG. 3A, the first electrode 1011 is a lower electrode, and the second electrode 1013 is an upper electrode. The first electrode 1011 and the second electrode 1013 may be arranged differently. For example, the first electrode 1011 may be a lower electrode or an upper electrode. Likewise, the second electrode 1013 may be an upper electrode or a lower electrode. A buffer layer 108 may be disposed between the diaphragm 103 and the lower electrode. These different designations result from variations in the method for manufacturing the device, and each of the cases has the advantages of the present invention.

In the liquid discharge head, the diaphragm 103 bends upward and downward with the expansion and contraction of the piezoelectric material 1012, thereby applying pressure to a liquid in the individual liquid chamber 102. This allows the liquid to be discharged from the discharge port 105. A liquid discharge head according to an embodiment of the present invention can be used in printers and in the manufacture of electronic equipment. The diaphragm 103 has a thickness of 1.0 µm or more and 15 µm or less, preferably 1.5 µm or more and 8 µm or less. The material of the diaphragm is not particularly limited and may be Si. Si of the diaphragm may be doped with boron or phosphorus. The buffer layer and the electrode on the diaphragm may constitute the diaphragm. The buffer layer 108 has a thickness of 5 nm or more and 300 nm or less, preferably 10 nm or more and 200 nm or less. The discharge port 105 has an equivalent circular diameter of 5 µm or more and 40 µm or less. The discharge port 105 may be circular, star-shaped, square, or triangular.

(Liquid Discharge Apparatus)

A liquid discharge apparatus according to an embodiment of the present invention will be described below. The liquid discharge apparatus includes a stage configured to receive an object and the liquid discharge head.

Figure 4:
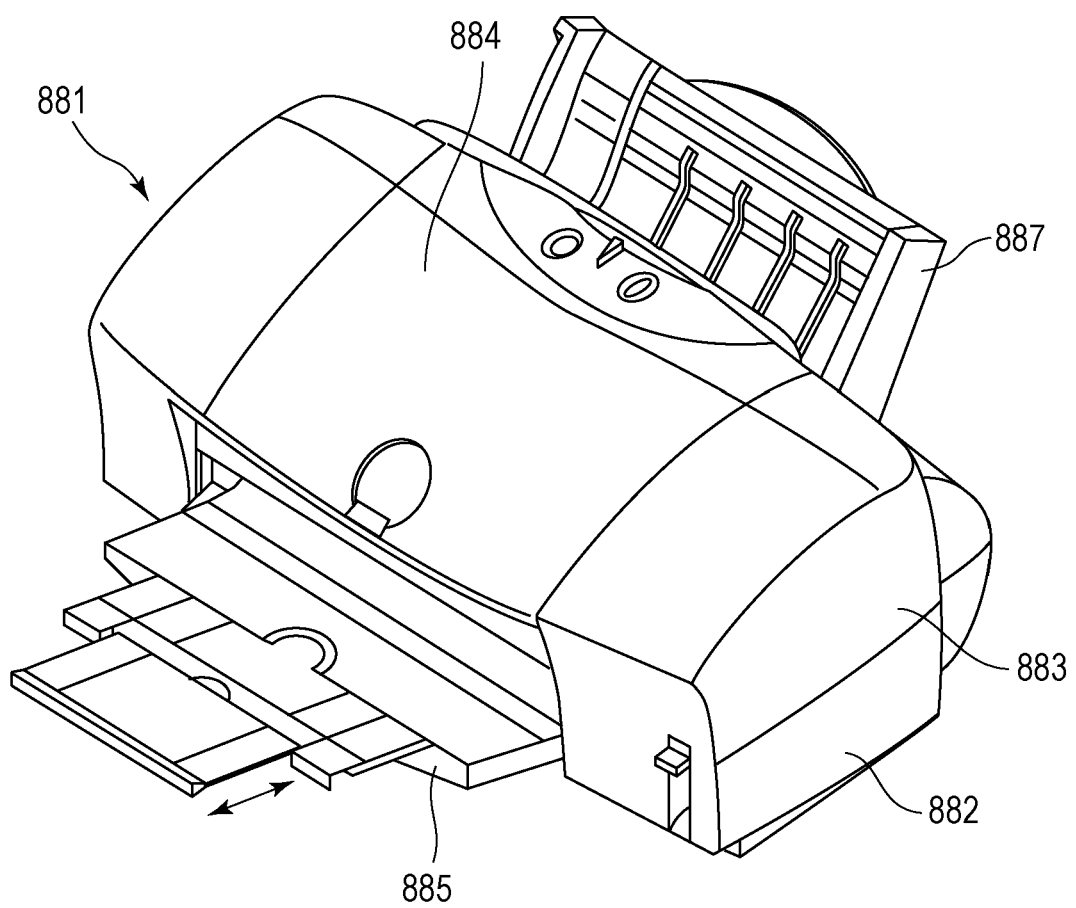
FIG. 4 is a schematic view of a liquid discharge apparatus according to an embodiment of the present invention.
Figure 5:
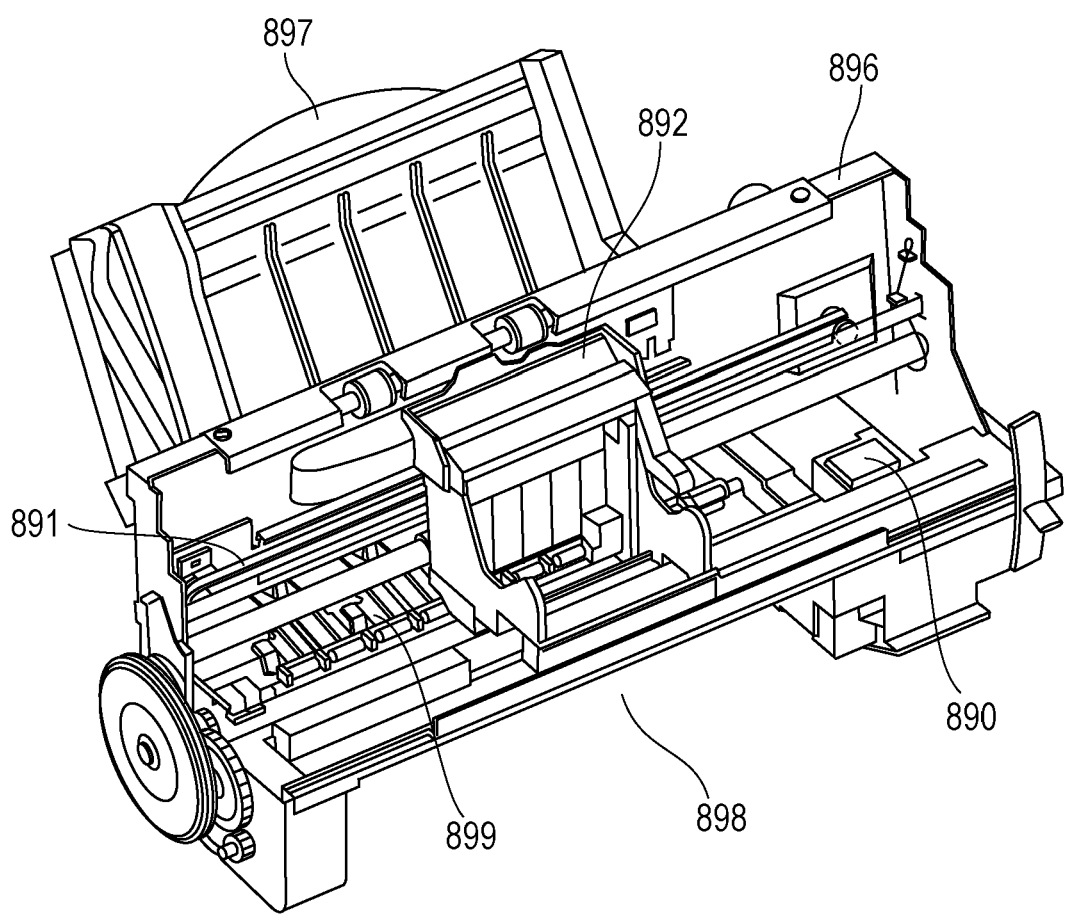
FIG. 5 is a schematic view of a liquid discharge apparatus according to an embodiment of the present invention.

The liquid discharge apparatus may be an ink jet recording apparatus, as illustrated in FIGS. 4 and 5. FIG. 5 illustrates the liquid discharge apparatus (ink jet recording apparatus) 881 illustrated in FIG. 4 without exteriors 882 to 885 and 887. The ink jet recording apparatus 881 includes an automatic feeder 897 for automatically feeding a recording paper sheet as a recording medium to the main body 896 of the apparatus. The ink jet recording apparatus 881 further includes a conveying unit 899, which conveys a recording paper sheet from the automatic feeder 897 to a predetermined recording position and from the recording position to an outlet 898, a stage configured to receive an object, a recording unit 891 for recording to the recording paper at the recording position, and a recovering unit 890 for recovering the recording unit 891. The recording unit 891 includes a carriage 892 for housing a liquid discharge head according to an embodiment of the present invention. The carriage 892 travels along a rail.

In such an ink jet recording apparatus, the carriage 892 travels along a rail in response to electric signals sent from a computer. Upon the application of a driving voltage to electrodes disposed on a piezoelectric material, the piezoelectric material is deformed. Upon the deformation, the piezoelectric material presses the individual liquid chamber 102 via the diaphragm 103 illustrated in FIG. 3B, thereby discharging an ink from the discharge port 105 to print characters. A liquid discharge apparatus according to an embodiment of the present invention can uniformly discharge a liquid at a high speed and can be reduced in size.

In addition to the printer described above, a liquid discharge apparatus according to an embodiment of the present invention can be used in printing apparatuses, for example, ink jet recording apparatuses, such as facsimile machines, multifunction devices, and copying machines, industrial liquid discharge apparatuses, and drawing apparatuses for objects. Users can select a desired transfer medium for each application. The liquid discharge head may move relative to a transfer medium disposed on a stage serving as a mounting portion.

(Ultrasonic Motor)

An ultrasonic motor according to an embodiment of the present invention includes a vibrating member and a moving body in contact with the vibrating member. The vibrating member includes a piezoelectric element or a multilayered piezoelectric element according to an embodiment of the present invention.

Figure 6A:
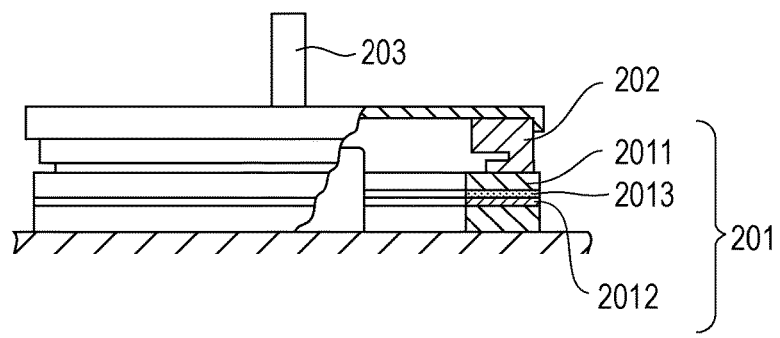
FIGS. 6A and 6B are schematic views of an ultrasonic motor according to an embodiment of the present invention.
Figure 6B:
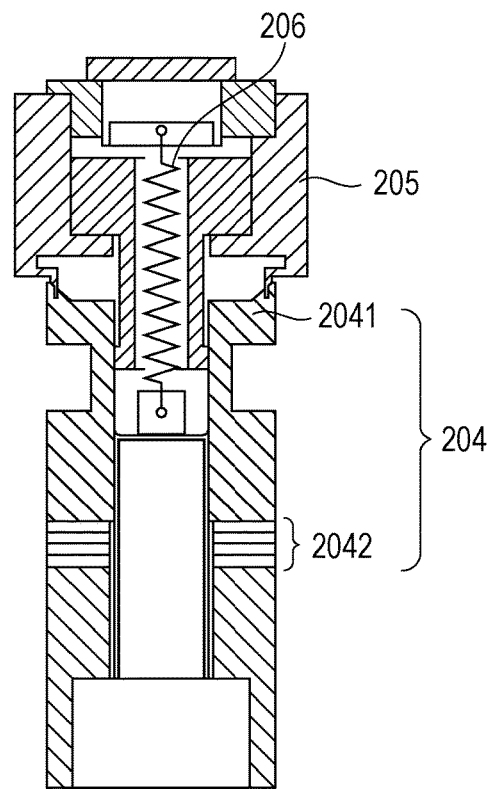

FIGS. 6A and 6B are schematic views of an ultrasonic motor according to an embodiment of the present invention. The ultrasonic motor illustrated in FIG. 6A includes a single plate of a piezoelectric element according to an embodiment of the present invention. The ultrasonic motor includes an oscillator 201, a rotor 202 pressed against a sliding surface of the oscillator 201 by the action of a pressure spring (not shown), and an output shaft 203, which is formed integrally with the rotor 202.

The oscillator 201 includes a metal elastic ring 2011, a piezoelectric element 2012 according to an embodiment of the present invention, and an organic adhesive 2013 (such as epoxy or cyanoacrylate) that bonds the piezoelectric element 2012 to the elastic ring 2011.

Although not shown in the figure, the piezoelectric element 2012 includes a piezoelectric material between a first electrode and a second electrode. Upon the application of two-phase alternating voltages that differ by an odd number times π/2 in phase to a piezoelectric element according to an embodiment of the present invention, a flexural traveling wave occurs in the oscillator 201, and points on the sliding surface of the oscillator 201 go through elliptical motion. The rotor 202 pressed against the sliding surface of the oscillator 201 receives friction force from the oscillator 201 and rotates in a direction opposite to the direction of the flexural traveling wave.

A body to be driven (not shown) joined to the output shaft 203 is driven by the rotational force of the rotor 202. Upon the application of a voltage to a piezoelectric material, the piezoelectric material expands and contracts because of the transverse piezoelectric effect. An elastic body, such as a metal, joined to the piezoelectric element is bent with the expansion and contraction of the piezoelectric material. The ultrasonic motor described herein utilizes this principle.

FIG. 6B illustrates an ultrasonic motor that includes a multilayered piezoelectric element. The oscillator 204 includes a multilayered piezoelectric element 2042 in a tubular metal elastic body 2041. The multilayered piezoelectric element 2042 includes a plurality of layered piezoelectric materials (not shown) and includes a first electrode and a second electrode on the outer surfaces of the layered piezoelectric materials and internal electrodes within the layered piezoelectric materials. The metal elastic body 2041 is fastened with a bolt to hold the piezoelectric element 2042, thereby constituting the oscillator 204.

Upon the application of alternating voltages of different phases to the piezoelectric element 2042, the oscillator 204 causes two oscillations perpendicular to each other. The two oscillations are synthesized to form a circular oscillation for driving the tip of the oscillator 204. The oscillator 204 has an annular groove at its upper portion. The annular groove increases the oscillatory displacement for driving. A rotor 205 is pressed against the oscillator 204 by the action of a pressure spring 206 and receives friction force for driving. The rotor 205 is rotatably supported by a bearing.

(Optical Apparatus)

An optical apparatus according to an embodiment of the present invention will be described below. The optical apparatus includes a drive unit that includes the ultrasonic motor described above.

Figure 7A:
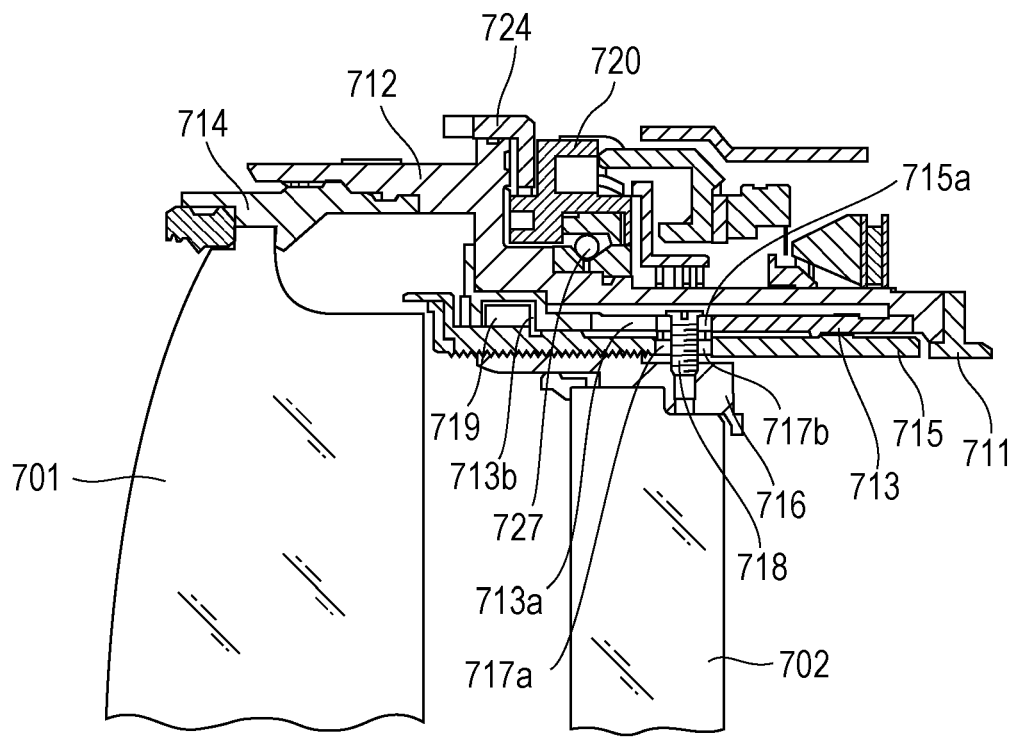
FIGS. 7A and 7B are schematic views of an optical apparatus according to an embodiment of the present invention.
Figure 7B:
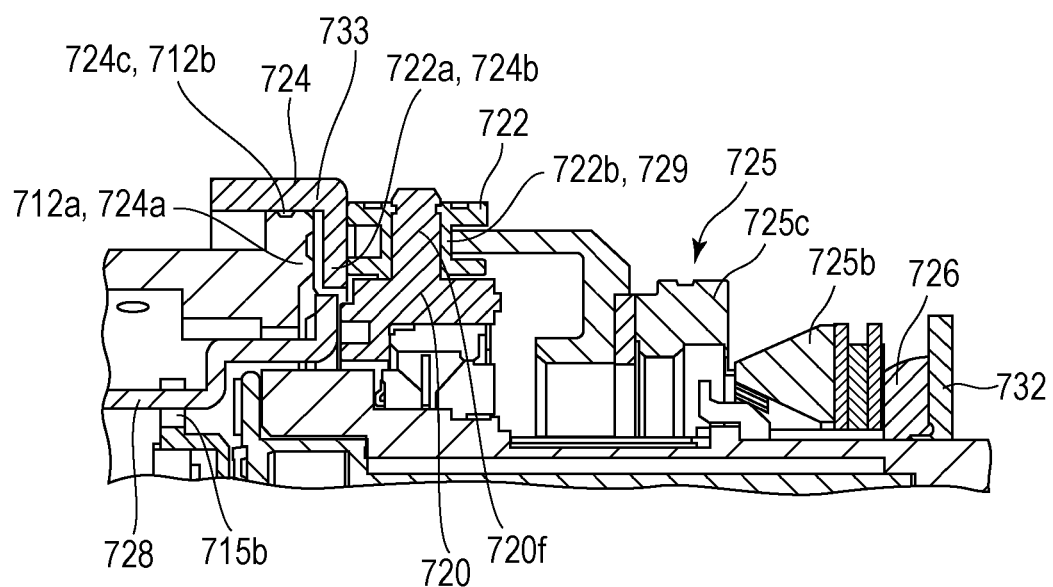
Figure 8:
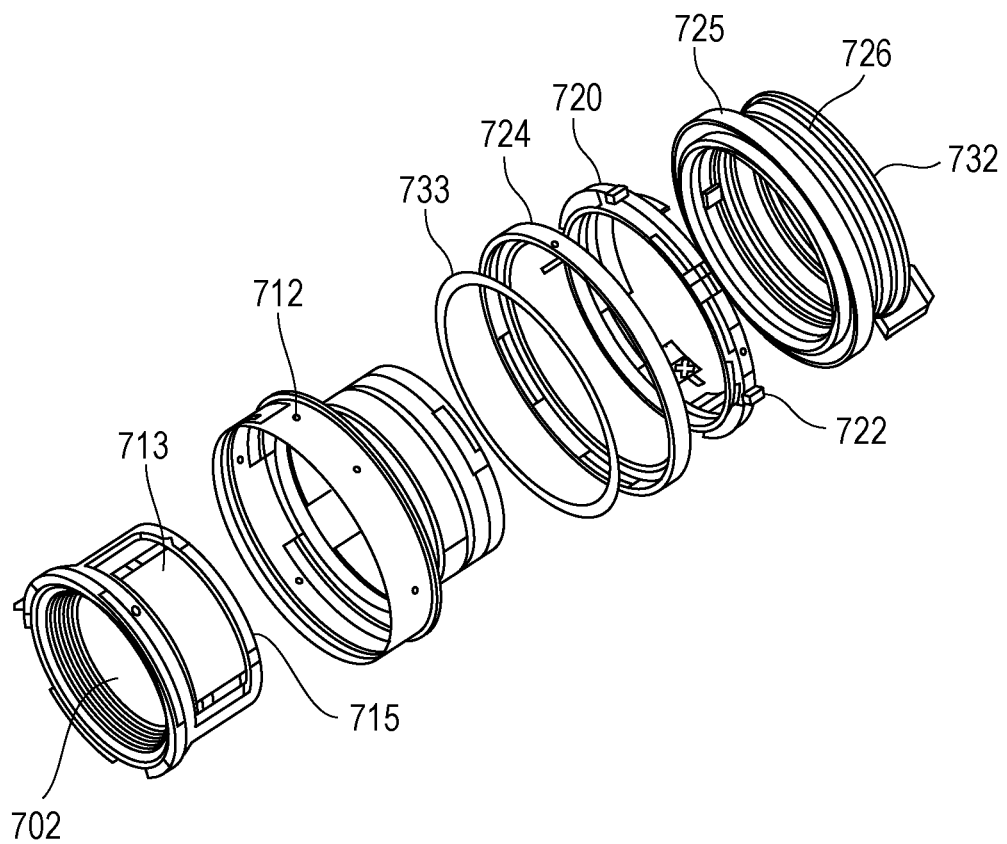
FIG. 8 is a schematic view of an optical apparatus according to an embodiment of the present invention.

FIGS. 7A and 7B are cross-sectional views of an interchangeable lens barrel of a single-lens reflex camera, which is an optical apparatus according to an embodiment of the present invention. FIG. 8 is an exploded perspective view of an interchangeable lens barrel of a single-lens reflex camera, which is an optical apparatus according to an embodiment of the present invention. A fixed barrel 712, a linear guide barrel 713, and a front lens group barrel 714 are fixed to a removable mount 711 of the camera. These components are fixed members of the interchangeable lens barrel.

The linear guide barrel 713 has a linear guide groove 713a for a focus lens 702 in the optical axis direction. The focus lens 702 is supported by a rear lens group barrel 716. Cam rollers 717a and 717b protruding outwardly in the radial direction are fixed to the rear lens group barrel 716 with a screw 718. The cam roller 717a fits in the linear guide groove 713a.

A cam ring 715 rotatably fits in the internal circumference of the linear guide barrel 713. A roller 719 fixed to the cam ring 715 is caught in an annular groove 713b of the linear guide barrel 713, thereby restricting the relative displacement of the linear guide barrel 713 and the cam ring 715 in the optical axis direction. The cam ring 715 has a cam groove 715a for the focus lens 702. The cam roller 717b also fits in the cam groove 715a.

A rotation transmitting ring 720 is rotatably held by a ball race 727 at a fixed position on the periphery of the fixed barrel 712. A driven roller 722 is rotatably held by a shaft 720f extending radially from the rotation transmitting ring 720. A large-diameter portion 722a of the driven roller 722 is in contact with a mount side end face 724b of a manual focus ring 724. A small-diameter portion 722b of the driven roller 722 is in contact with a joint 729. Six driven rollers 722 are disposed at regular intervals on the periphery of the rotation transmitting ring 720. Each of the driven rollers 722 satisfies the structural relationship described above.

A low-friction sheet (washer member) 733 is disposed on the inside of the manual focus ring 724. The low-friction sheet 733 is disposed between a mount side end face 712a of the fixed barrel 712 and a front end face 724a of the manual focus ring 724. The low-friction sheet 733 has a circular outer surface having a diameter that fits to the inner diameter 724c of the manual focus ring 724. The inner diameter 724c of the manual focus ring 724 fits to the diameter of an outer portion 712b of the fixed barrel 712. The low-friction sheet 733 can reduce friction in the rotating ring mechanism in which the manual focus ring 724 rotates about the optical axis relative to the fixed barrel 712.

The large-diameter portion 722a of the driven roller 722 is pressed against the mount side end face 724b of the manual focus ring 724 because the wave washer 726 presses the ultrasonic motor 725 forward to the front of the lens. Likewise, because the wave washer 726 presses the ultrasonic motor 725 forward to the front of the lens, the small-diameter portion 722b of the driven roller 722 is pressed against the joint 729.

The wave washer 726 is prevented from moving toward the mount by a washer 732 bayonet coupled to the fixed barrel 712. The spring force (impellent force) of the wave washer 726 is transmitted to the ultrasonic motor 725 and the driven roller 722 and also presses the manual focus ring 724 against the mount side end face 712a of the fixed barrel 712.

In other words, the manual focus ring 724 is pressed against the mount side end face 712a of the fixed barrel 712 via the low-friction sheet 733.

Thus, when the ultrasonic motor 725 is rotated by a control unit (not shown) relative to the fixed barrel 712, the driven roller 722 rotates about the shaft 720f because the joint 729 is in frictional contact with the small-diameter portion 722b of the driven roller 722. The rotation of the driven roller 722 about the shaft 720f causes the rotation of the rotation transmitting ring 720 about the optical axis (automatic focusing).

When a manual input unit (not shown) provides the manual focus ring 724 with rotational force about the optical axis, since the mount side end face 724b of the manual focus ring 724 is pressed against the large-diameter portion 722a of the driven roller 722, the driven roller 722 is rotated about the shaft 720f because of friction force. The rotation of the large-diameter portion 722a of the driven roller 722 about the shaft 720f causes the rotation of the rotation transmitting ring 720 about the optical axis. However, the ultrasonic motor 725 is not rotated because of the friction force between a rotor 725c and a stator 725b (manual focusing).

The rotation transmitting ring 720 is provided with two focus keys 728 facing each other. These focus keys 728 fit into notches 715b at the tip of the cam ring 715. Upon automatic focusing or manual focusing, the rotation transmitting ring 720 is rotated about the optical axis, and the rotational force is transmitted to the cam ring 715 via the focus keys 728. When the cam ring 715 is rotated about the optical axis, the cam roller 717b moves the cam roller 717a and the rear group lens barrel 716 restricted by the linear guide groove 713a forward or backward along the cam groove 715a of the cam ring 715. This drives the focus lens 702 and allows focusing.

Although an optical apparatus according to an embodiment of the present invention has been described with reference to an interchangeable lens barrel of a single-lens reflex camera, the optical apparatus may also be applied to optical apparatuses that include an ultrasonic motor in a drive unit, for example, cameras, such as compact cameras, electronic still cameras, and personal digital assistants including a camera.

(Vibratory Apparatus and Dust Removing Device)

Vibratory apparatuses for conveying or removing particles, powders, and droplets are widely used in electronic equipment.

As an example of a vibratory apparatus according to the present invention, a dust removing device that includes a piezoelectric element according to an embodiment of the present invention will be described below. A vibratory apparatus according to an embodiment of the present invention includes a vibrating member that includes the piezoelectric element or the multilayered piezoelectric element described above disposed on a diaphragm. The dust removing device includes a vibrating portion that includes the vibratory apparatus described above.

Figure 9A:
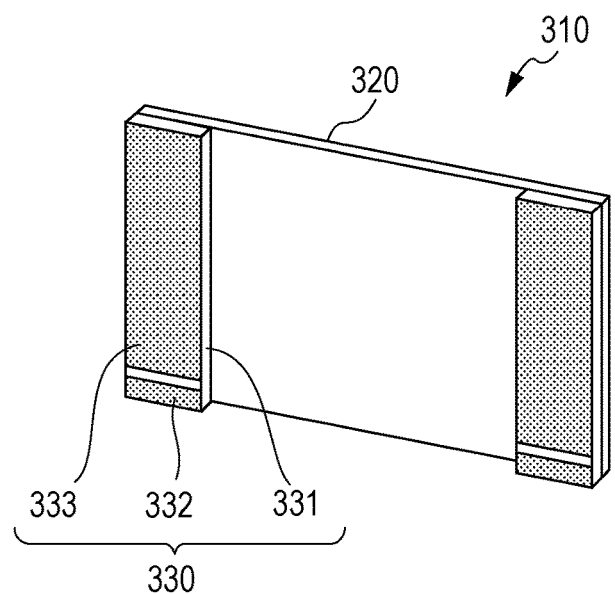
FIGS. 9A and 9B are schematic views of a dust removing device including a vibratory apparatus according to an embodiment of the present invention.
Figure 9B:
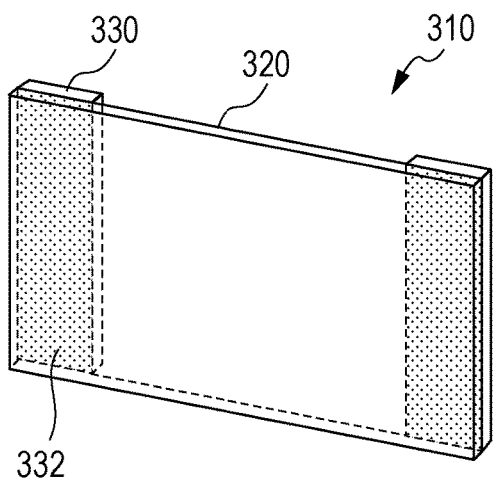

FIGS. 9A and 9B are schematic views of a dust removing device 310 according to an embodiment of the present invention. The dust removing device 310 includes a plate of the piezoelectric element 330 and the diaphragm 320. The piezoelectric element 330 may be a multilayered piezoelectric element according to an embodiment of the present invention. The diaphragm 320 may be made of any material. When the dust removing device 310 is used in optical devices, the diaphragm 320 may be made of a translucent or transparent material or a light reflective material.

Figure 10A:
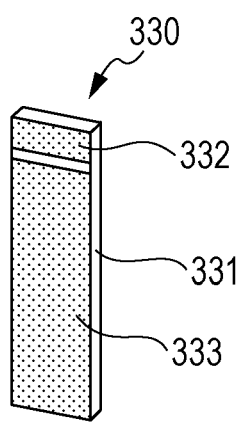
FIGS. 10A to 10C are schematic views of a piezoelectric element of a dust removing device according to an embodiment of the present invention.
Figure 10B:
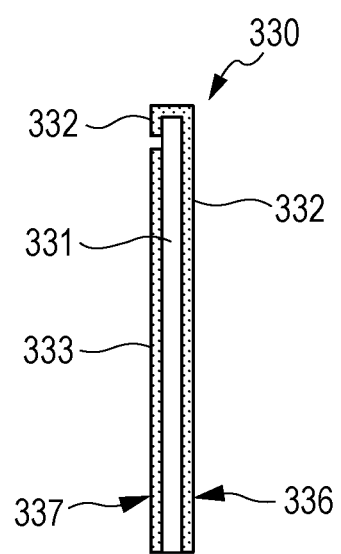
Figure 10C:
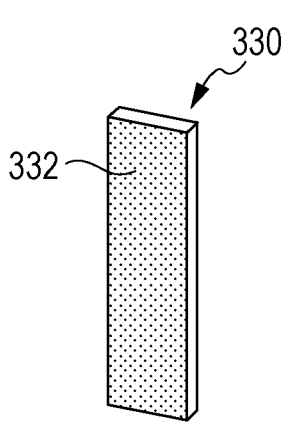

FIGS. 10A to 10C are schematic views of the piezoelectric element 330 illustrated in FIGS. 9A and 9B. FIGS. 10A and 10C illustrate the front and back sides of the piezoelectric element 330. FIG. 10B is a side view of the piezoelectric element 330. As illustrated in FIGS. 9A and 9B, the piezoelectric element 330 includes a piezoelectric material 331, a first electrode 332, and a second electrode 333. The first electrode 332 and the second electrode 333 are disposed on opposite sides of the piezoelectric material 331.

As in FIGS. 9A and 9B, the piezoelectric element 330 may be a multilayered piezoelectric element according to an embodiment of the present invention. In this case, the piezoelectric material 331 includes piezoelectric material layers and internal electrodes alternately stacked on top of one another. The internal electrodes are alternately connected to the first electrode 332 and the second electrode 333, thereby allowing the piezoelectric material layers to alternately have drive waveforms of different phases.

As illustrated in FIG. 10C, a surface of the piezoelectric element 330 on which the first electrode 332 is disposed is referred to as a first electrode surface 336. As illustrated in FIG. 10A, a surface of the piezoelectric element 330 on which the second electrode 333 is disposed is referred to as a second electrode surface 337.

The term "electrode surface", as used herein, refers to a surface of a piezoelectric element on which an electrode is disposed. For example, as illustrated in FIG. 10B, the first electrode 332 may round a corner and extends to the second electrode surface 337.

As illustrated in FIGS. 9A and 9B, the first electrode surface 336 of the piezoelectric element 330 is bonded to the diaphragm 320. Actuation of the piezoelectric element 330 produces a stress between the piezoelectric element 330 and the diaphragm 320, causing out-of-plane oscillations on the diaphragm 320. The dust removing device 310 removes foreign matter, such as dust, on the diaphragm 320 by the action of out-of-plane oscillations. The term "out-of-plane oscillations", as used herein, refers to elastic oscillations that cause displacements of a diaphragm in the optical axis direction or the diaphragm thickness direction.

FIGS. 11A and 11B are schematic views illustrating the vibration principle of the dust removing device 310. In FIG. 11A, in-phase alternating voltages are applied to a left-and-right pair of the piezoelectric elements 330 to cause out-of-plane oscillations of the diaphragm 320. The direction of polarization of the piezoelectric material constituting the left-and-right pair of the piezoelectric elements 330 is the same as the thickness direction of the piezoelectric elements 330. The dust removing device 310 is driven in a seventh oscillation mode.

In FIG. 11B, an anti-phase alternating voltage is applied to a left-and-right pair of the piezoelectric elements 330 to cause out-of-plane oscillations of the diaphragm 320. The dust removing device 310 is driven in a sixth oscillation mode. The dust removing device 310 can employ at least two oscillation modes to effectively remove dust on the surface of the diaphragm.

(Image Pickup Apparatus)

An image pickup apparatus according to an embodiment of the present invention will be described below.

Figure 12:
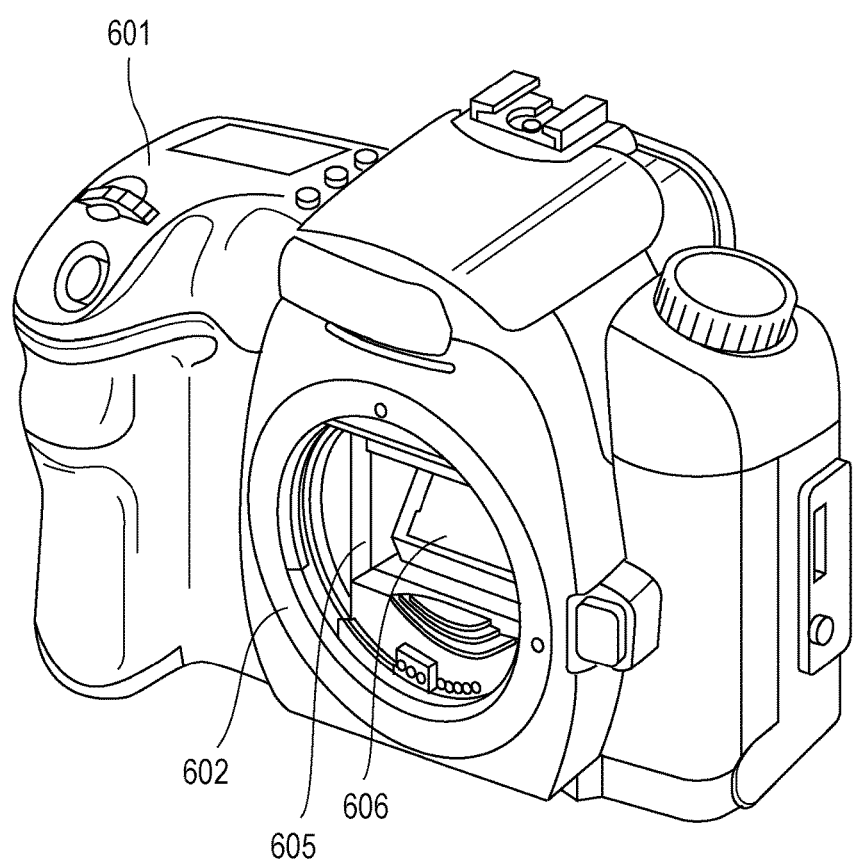
FIG. 12 is a schematic view of an image pickup apparatus according to an embodiment of the present invention.
Figure 13:
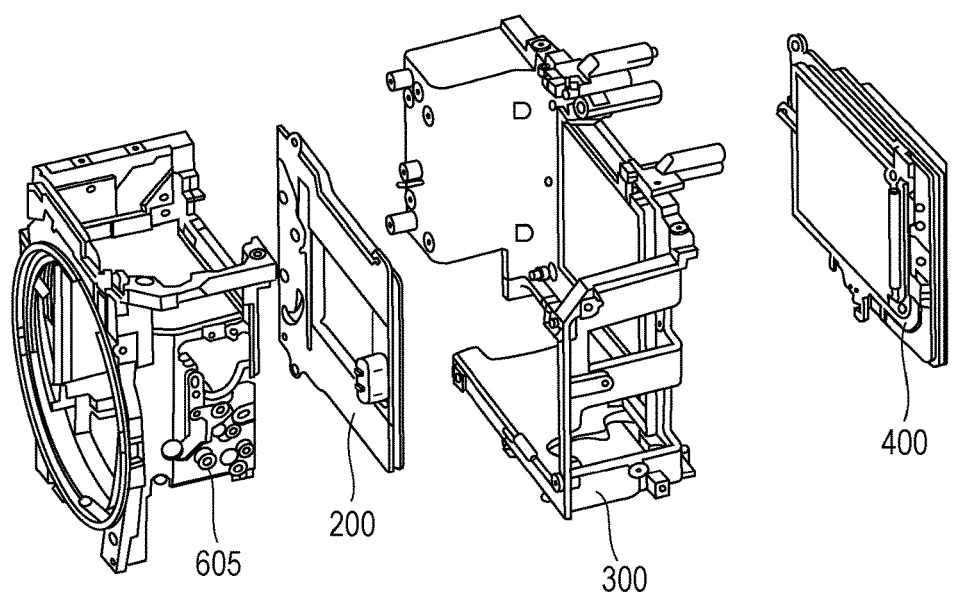
FIG. 13 is a schematic view of an image pickup apparatus according to an embodiment of the present invention.

An image pickup apparatus according to an embodiment of the present invention includes a dust removing device according to an embodiment of the present invention and an image pickup element unit, wherein the dust removing device includes a diaphragm on the light-receiving surface side of the image pickup element unit, and the dust removing device is disposed on the light-receiving surface side of the image pickup element unit. FIGS. 12 and 13 illustrate a digital single-lens reflex camera, which is an image pickup apparatus according to an embodiment of the present invention.

FIG. 12 is a front perspective view of the main body 601 of the camera viewed from the object side. An imaging lens unit has been removed. FIG. 13 is an exploded perspective view of the inside of the camera, illustrating surrounding structures of a dust removing device according to an embodiment of the present invention and an image pickup unit 400.

The main body 601 of the camera includes a mirror box 605 to which an image light beam passing through an imaging lens is directed. The mirror box 605 includes a main mirror (quick return mirror) 606. The main mirror 606 can make an angle of 45 degrees with the optical axis to direct an image light beam to a penta roof mirror (not shown) or may avoid the image light beam in order to direct the image light beam to an image pickup element (not shown).

The mirror box 605 and a shutter unit 200 are disposed in front of a main body chassis 300 of the main body 601 of the camera in this order from the object side. The image pickup unit 400 is disposed on the photographer side of the main body chassis 300. The image pickup unit 400 is installed such that an image pickup surface of the image pickup element is disposed at a predetermined distance from and parallel to the surface of a mount 602 to which an imaging lens unit is to be attached. The image pickup unit 400 includes a vibrating component of a dust removing device and an image pickup element unit. The vibrating component of the dust removing device is disposed on the same axis as the light-receiving surface of the image pickup element unit.

Although the digital single-lens reflex camera has been described as an image pickup apparatus according to an embodiment of the present invention, the image pickup apparatus may be an interchangeable-lens camera, such as a mirrorless digital interchangeable-lens camera without the mirror box 605. Among various image pickup apparatuses and electrical and electronic equipment that include image pickup apparatuses, such as interchangeable-lens video cameras, copying machines, facsimile machines, and scanners, an image pickup apparatus according to an embodiment of the present invention can particularly be applied to devices that require the removal of dust deposited on a surface of an optical component.

(Electronic Equipment)

Electronic equipment according to an embodiment of the present invention will be described below. Electronic equipment according to an embodiment of the present invention includes a piezoelectric acoustic component that includes the piezoelectric element or the multilayered piezoelectric element described above. The piezoelectric acoustic component may be a loudspeaker, a buzzer, a microphone, or a surface acoustic wave (SAW) device.

Figure 14:
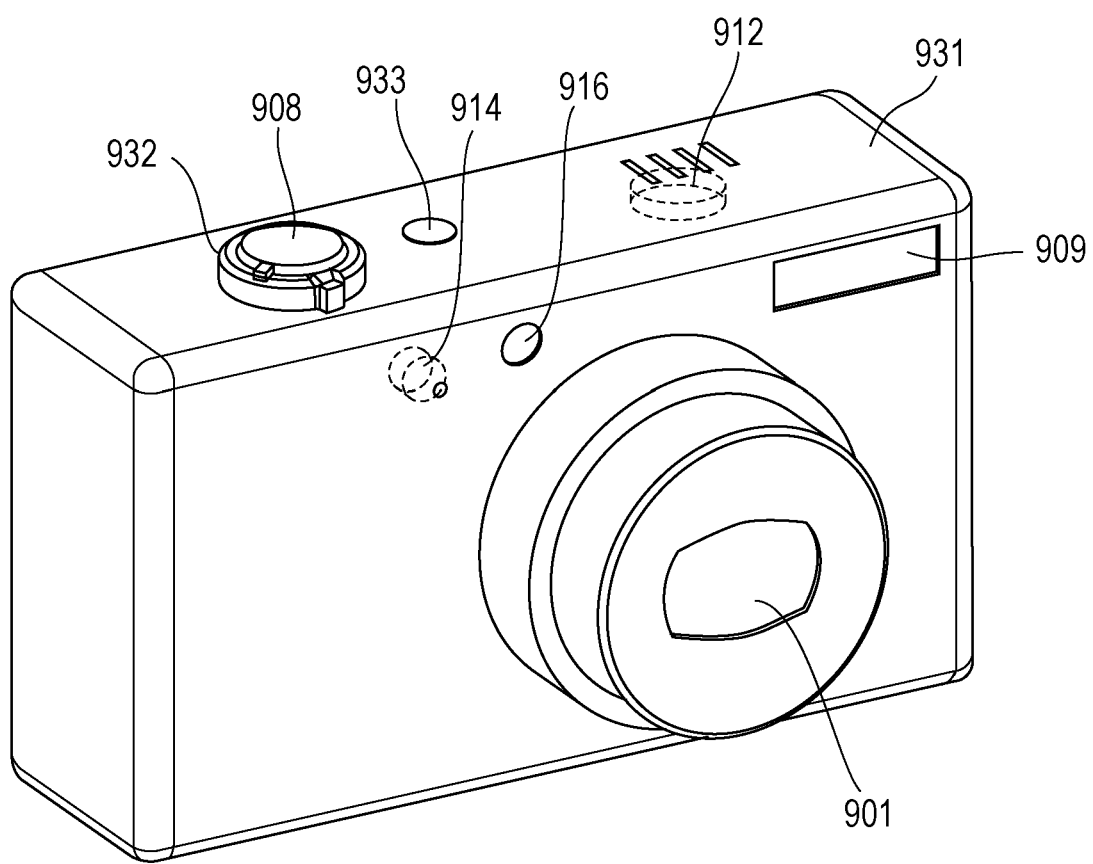
FIG. 14 is a schematic view of electronic equipment according to an embodiment of the present invention.

FIG. 14 is a front perspective view of the main body 931 of a digital camera, which is electronic equipment according to an embodiment of the present invention. An optical device 901, a microphone 914, an electronic flash unit 909, and a fill light unit 916 are disposed on the front surface of the main body 931. The microphone 914 is disposed within the main body and is indicated by a broken line. An opening for catching external sound is disposed in front of the microphone 914.

A power switch 933, a loudspeaker 912, a zoom lever 932, and a release button 908 for focusing are disposed on the top surface of the main body 931. The loudspeaker 912 is disposed within the main body 931 and is indicated by a broken line. An opening for transmitting sound to the outside is disposed in front of the loudspeaker 912.

The piezoelectric acoustic component may be used in at least one of the microphone 914, the loudspeaker 912, and a surface acoustic wave device.

Although the digital camera has been described as electronic equipment according to an embodiment of the present invention, the electronic equipment may also be applied to electronic equipment that includes a piezoelectric acoustic component, such as audio-reproducing devices, audio-recording devices, mobile phones, and information terminals.

As described above, a piezoelectric element and a multilayered piezoelectric element according to an embodiment of the present invention are suitable for liquid discharge heads, liquid discharge apparatuses, ultrasonic motors, optical apparatuses, vibratory apparatuses, dust removing devices, image pickup apparatuses, and electronic equipment.

A liquid discharge head manufactured by using a piezoelectric element or a multilayered piezoelectric element according to an embodiment of the present invention can have a nozzle density and a discharge velocity higher than or equal to those of liquid discharge heads manufactured by using a lead-containing piezoelectric element.

A liquid discharge apparatus manufactured by using a liquid discharge head according to an embodiment of the present invention can have a discharge velocity and discharge accuracy higher than or equal to those of liquid discharge apparatuses manufactured by using a lead-containing piezoelectric element.

An ultrasonic motor manufactured by using a piezoelectric element or a multilayered piezoelectric element according to an embodiment of the present invention can have driving force and durability higher than or equal to those of ultrasonic motors manufactured by using a lead-containing piezoelectric element.

An optical apparatus manufactured by using an ultrasonic motor according to an embodiment of the present invention can have durability and operation accuracy higher than or equal to those of optical apparatuses manufactured by using a lead-containing piezoelectric element.

A vibratory apparatus manufactured by using a piezoelectric element or a multilayered piezoelectric element according to an embodiment of the present invention can have vibratory capacity and durability higher than or equal to those of ultrasonic motors manufactured by using a lead-containing piezoelectric element.

A dust removing device manufactured by using a vibratory apparatus according to an embodiment of the present invention can have dust removal efficiency and durability higher than or equal to those of dust removing devices manufactured by using a lead-containing piezoelectric element.

An image pickup apparatus manufactured by using a dust removing device according to an embodiment of the present invention can have a dust removal function higher than or equal to those of image pickup apparatuses manufactured by using a lead-containing piezoelectric element.

A piezoelectric acoustic component that includes a piezoelectric element or a multilayered piezoelectric element according to an embodiment of the present invention can be used to provide electronic equipment that has sound production ability higher than or equal to those of electronic equipment manufactured by using a lead-containing piezoelectric element.

A piezoelectric material according to an embodiment of the present invention may be used in ultrasonic transducers, piezoelectric actuators, piezoelectric sensors, and ferroelectric memories, as well as liquid discharge heads and motors.

EXAMPLES

Although a piezoelectric material according to the present invention is more specifically described in the following examples, the present invention is not limited to these examples.

Piezoelectric materials according to examples and comparative examples and their intermediates were processed and tested as described below.

The piezoelectric materials were polished to a thickness of approximately 0.5 mm. The density of the piezoelectric materials was measured using Archimedes' principle. The criterion for crystallization was 95% or more of the theoretical density. The crystal phase and the lattice constant of the piezoelectric materials were measured by X-ray diffraction.

Comparative Example 1

A comparative metal oxide material was prepared from a solid solution of a sodium niobate main component and barium titanate (NN-BT). Sodium niobate ($NaNbO_3$) and barium titanate ($BaTiO_3$) powders were used as raw materials. The sodium niobate powder contained at least 99% pure sodium niobate ($NaNbO_3$), and the barium titanate powder contained at least 99% pure barium titanate ($BaTiO_3$).

The raw materials were weighed and mixed so as to yield a target composition $Na_xBa_{1-z}Nb_zTi_{1-z}O_3$ (z=x'=0.88). The mixed powder was calcined in the ambient atmosphere at a temperature in the range of 1000° C. to 1100° C. for 2 to 5 hours. The calcined powder was pulverized and was granulated together with a binder. The granulated powder was charged into a mold and was compressed to yield a compact having a diameter of 17 mm and a thickness of approximately 1 mm. The compact was fired in the air at a maximum temperature of 1280° C. for 2 to 6 hours to yield a sintered body. The surface of the sintered body was observed with an optical microscope. The sintered body had an average grain size in the range of 0.5 to 60 μm.

The X-ray diffraction showed that the samples were substantially composed of a single phase of the perovskite structure. The density of the sintered body was 95% or more of the theoretical density. An inductively coupled plasma emission spectroscopy (ICP) analysis of the composition of the sintered body showed that the sodium content was approximately 5% lower than that in the target composition. The barium, niobium, and titanium contents were the same as those of the target composition.

Examples 1 to 4

Sodium niobate ($NaNbO_3$) and barium zirconate ($BaZrO_3$) powders were weighed and mixed so as to yield a target composition $Na_xBa_{1-y}Nb_yZr_{1-y}O_3$ (x'=y=0.96 (Example 1), 0.95 (Example 2), 0.92 (Example 3), or 0.90 (Example 4)).

Sodium niobate ($NaNbO_3$) and barium zirconate ($BaZrO_3$) powders were used as raw materials. The sodium niobate powder contained at least 99% pure sodium niobate ($NaNbO_3$), and the barium zirconate powder contained at least 99% pure barium zirconate ($BaZrO_3$).

The mixed powder was granulated together with a binder. The granulated powder was charged into a mold and was compressed to yield a compact having a diameter of 17 mm and a thickness of approximately 1 mm. The compact was fired in the air at a temperature in the range of 1200° C. to 1300° C. for 2 to 6 hours to yield a sintered body. The surface of the sintered body was observed with an optical microscope. The sintered body had an average grain size in the range of 0.5 to 50 μm.

The X-ray diffraction of the sintered piezoelectric material showed that the sample was substantially composed of a single phase of the perovskite structure. The density of the piezoelectric material was 95% or more of the theoretical density. An ICP analysis of the composition of the piezoelectric material showed that the sodium content was approximately 1% to 5% lower than that in the target composition. The barium, niobium, and zirconium contents were the same as those of the target composition.

Examples 5 to 8

Sodium niobate ($NaNbO_3$) and barium zirconate ($BaZrO_3$) powders were weighed so as to yield a target composition $Na_xBa_{1-y}Nb_yZr_{1-y}O_3$ (x'=y=0.96 (Example 5), 0.95 (Example 6), 0.93 (Example 7), or 0.90 (Example 8)). These powders were mixed with a Cu component. The amount of the Cu component corresponded to 0.4 mol % of the amount of the perovskite-type metal oxide having the target composition $Na_xBa_{1-y}Nb_yZr_{1-y}O_3$. The Cu content of 0.4 mol % in Examples 5 to 8 means that the weight of CuO was 0.318 g (0.254 g of Cu) per mol of the perovskite-type metal oxide having the general formula (1) (168 g).

Sodium niobate ($NaNbO_3$) and barium zirconate ($BaZrO_3$) powders were used as raw materials. The sodium niobate powder contained at least 99% pure sodium niobate ($NaNbO_3$), the barium zirconate powder contained at least 99% pure barium zirconate ($BaZrO_3$), and the Cu component was 99.9% pure copper oxide (Cu(II)O).

The mixed powder was granulated together with a binder. The granulated powder was charged into a mold and was compressed to yield a compact having a diameter of 17 mm and a thickness of approximately 1 mm. The compact was fired in the air at a temperature in the range of 1200° C. to 1300° C. for 2 to 6 hours to yield a sintered body. The surface of the sintered body was observed with an optical microscope. The sintered body had a grain size in the range of 0.5 to 50 μm.

The X-ray diffraction of the sintered piezoelectric material showed that the sample was substantially composed of a single phase of the perovskite structure. The density of the piezoelectric material was 95% or more of the theoretical density. An ICP analysis of the composition of the piezoelectric material showed that the sodium content was approximately 1% to 5% lower than that in the target composition. The barium, niobium, zirconia, and copper contents were the same as those of the target composition.

Comparative Examples 2 and 3

Comparative metal oxide materials were prepared in the same manner as in Examples 5 to 8 except that the raw material powders were weighed such that x=y=1.00 (Comparative Example 2) or 0.97 (Comparative Example 3). The compact was fired in the air at a temperature in the range of 1200° C. to 1300° C. for 1 to 6 hours to yield a sintered body. The surface of the sintered body was observed with an optical microscope. The sintered body had a grain size in the range of 0.5 to 500 μm. The polarization-electric field hysteresis loop of the sintered body showed that the sintered bodies according to Comparative Examples 2 and 3 were antiferroelectric substances. The sintered bodies according to Comparative Examples 2 and 3 subjected to polarization treatment had no piezoelectricity and no available mechanical quality factor. The measurement conditions of the polarization-electric field hysteresis loop included an alternating electric field (triangular wave) frequency in the range of 10 to 100 Hz and the maximum electric field intensity of ±50 kV/cm.

Comparative Example 4

A comparative metal oxide material was prepared in the same manner as in Examples 5 to 8 except that the raw material powders were weighed such that x=y=0.88. The compact was fired in the air at a temperature in the range of 1200° C. to 1300° C. for 1 to 6 hours to yield a sintered body. The surface of the sintered body was observed with an optical microscope. The sintered body had a grain size in the range of 0.1 to 20 μm. The sintered body had a Curie temperature as low as 60° C. and was unsuitable for practical use.

(Evaluation)

The surface of the piezoelectric materials according to Examples 1 to 8 was polished. The piezoelectric materials were heat-treated at a temperature in the range of 400° C. to 1000° C. in the air for one hour to remove organic components on the surface thereof. A gold electrode was formed on the front and back sides of each of the piezoelectric materials by DC sputtering to produce piezoelectric elements according to the present examples. 10 mm×2.5 mm×0.5 mm strips of the piezoelectric elements were used to evaluate various characteristics.

The metal oxide material according to Comparative Example 1 was processed in the same manner as in Examples 1 to 8 to prepare a comparative element. Various characteristics of the comparative element were evaluated.

Resistivity was measured using a non-polarizing element. A 10-V direct current bias was applied between two electrodes of an element. Twenty seconds after that, the resistivity of the element was determined from the leakage current. When the resistivity is 1 GΩ·cm or more, preferably 100 GΩ·cm or more, the piezoelectric material and the piezoelectric element have a satisfactory practical insulation property.

Before the evaluation of piezoelectricity, a sample was subjected to polarization treatment. More specifically, the sample was heated to a temperature in the range of 100° C. to 150° C. in an oil bath. A voltage in the range of 20 to 30 kV/cm was applied to the sample for 30 minutes, and the sample was cooled to room temperature while the voltage was maintained.

The Young's modulus ($Y_{11}$) and the mechanical quality factor (Qm) of the strips of the piezoelectric elements were measured using a resonance-antiresonance method.

The piezoelectric constant ($d_{33}$) of the sample was measured with a Berlincourt $d_{33}$ meter. The piezoelectric constants ($d_{33}$) of the piezoelectric elements according to Examples 1 to 8 ranged from 40 to 70 pC/N.

The Curie temperature was measured with an impedance analyzer. The relative dielectric constant was measured with the impedance analyzer at a measurement frequency of 1 kHz and an alternating voltage of 500 mV. Measurement was performed before polarization treatment. The temperature dependence of the relative dielectric constant was measured from room temperature. The change in relative dielectric constant was measured while a sample was cooled from room temperature to −100° C. and was then heated to 350° C. The Curie temperature Tc was calculated from the maximum relative dielectric constant.

Table 1 lists the initial composition ratio and the composition ratio after firing of the metal oxide material according to Comparative Example 1, and the resistivity, Curie temperature, mechanical quality factor (Qm), and Young's modulus ($Y_{11}$) of the element according to Comparative Example 1.

Table 2 lists the initial composition ratio and the composition ratio after firing of the piezoelectric materials according to Examples 1 to 8, and the resistivity, Curie temperature, mechanical quality factor (Qm), and Young's modulus ($Y_{11}$) of the piezoelectric elements according to Examples 1 to 8.

In Tables 1 and 2, x' denotes the initial composition ratio of Na, and x denotes the composition ratio of Na after firing. The initial Nb, Zr, and Ba composition ratios y and 1-y and the initial amount of Cu were not substantially changed by firing.

TABLE 1

| | $Na_xBa_{1-x}Nb_zTi_{1-z}O_3$ | | | Cu mol | Resistivity | Curie temperature | Mechanical quality factor | Young's modulus |
|---|---|---|---|---|---|---|---|---|
| | x' | x | z | [%] | [GΩ · cm] | [° C.] | [—] | [GPa] |
| Comparative example 1 | 0.88 | 0.84 | 0.88 | 0 | 5 | 195 | 277 | 127 |

TABLE 2

| | $Na_xBa_{1-x}Nb_yZr_{1-y}O_3$ | | | Cu mol | Resistivity | Curie temperature | Mechanical quality factor | Young's modulus |
|---|---|---|---|---|---|---|---|---|
| | x' | x | y | [%] | [GΩ · cm] | [° C.] | [—] | [GPa] |
| Example 1 | 0.96 | 0.95 | 0.96 | 0 | 38 | 295 | 760 | 131 |
| Example 2 | 0.95 | 0.94 | 0.95 | 0 | 40 | 225 | 785 | 134 |
| Example 3 | 0.92 | 0.90 | 0.92 | 0 | 55 | 220 | 412 | 120 |
| Example 4 | 0.90 | 0.88 | 0.90 | 0 | 6 | 165 | 325 | 113 |
| Example 5 | 0.96 | 0.95 | 0.96 | 0.40 | 402 | 300 | 871 | 144 |

TABLE 2-continued

| | $Na_{x'}Ba_{1-x'}Nb_xZr_{1-y}O_3$ | | | Cu mol [%] | Resistivity [GΩ·cm] | Curie temperature [°C.] | Mechanical quality factor [—] | Young's modulus [GPa] |
|---|---|---|---|---|---|---|---|---|
| | x' | x | y | | | | | |
| Example 6 | 0.95 | 0.94 | 0.95 | 0.40 | 414 | 230 | 910 | 147 |
| Example 7 | 0.93 | 0.92 | 0.93 | 0.40 | 625 | 225 | 466 | 131 |
| Example 8 | 0.90 | 0.88 | 0.90 | 0.40 | 91 | 170 | 361 | 123 |

Tables 1 and 2 show that the piezoelectric materials according to the present examples containing the solid solution of barium zirconate in sodium niobate had higher resistivity, Curie temperature, mechanical quality factor, and Young's modulus than the solid solution NN-BT of barium titanate in sodium niobate according to Comparative Example 1.

The dynamic characteristics of the piezoelectric elements according to Examples 1 to 8 and the element according to Comparative Example 1 were measured to assess stability in long-term driving. The piezoelectric constant $d_{33}$ was measured after an alternating voltage of 100 V was applied to a strip of an element for 100 hours at a frequency of 110 kHz, which is sufficiently separated from the resonance frequency. The rate of change in piezoelectric constant due to the voltage application was a 10% or more decrease in the element according to Comparative Example 1 and a 1% or less decrease in the piezoelectric elements according to Examples 1 to 8. Thus, the piezoelectric elements according to Examples 1 to 8 had higher stability in long-term driving.

Example 9

In the same manner as in Example 2, raw material powders were wet-blended, dried, and calcined at a temperature in the range of 900° C. to 1000° C. to yield a calcined product. This raw material was mixed with an organic binder and was formed into a green sheet having a thickness of 50 μm by a doctor blade method.

An electrically conductive paste for an internal electrode was applied to the green sheet. The electrically conductive paste contained a Ag 70%-Pd 30% alloy. Nine of the green sheets to which the electrically conductive paste had been applied were stacked and were fired at 1140° C. to yield a sintered body. The sintered body was cut into a 10 mm×2.5 mm piece. The side surfaces of the piece were polished. A pair of external electrodes (a first electrode and a second electrode) for alternately connecting internal electrodes were formed by Au sputtering. Thus, a multilayered piezoelectric element as illustrated in FIG. 2B was manufactured.

The observation of the internal electrodes of the multilayered piezoelectric element showed that the electrode material Ag—Pd and piezoelectric material layers were alternately stacked on top of one another.

Before the evaluation of piezoelectricity, a sample was subjected to polarization treatment. More specifically, the sample was heated to a temperature in the range of 100° C. to 150° C. on a hot plate. While a voltage of 30 kV/cm was applied between the first electrode and the second electrode for 30 minutes, the sample was cooled to room temperature.

The evaluation of the piezoelectric property of the multilayered piezoelectric element showed that the multilayered piezoelectric element had a sufficient mechanical quality factor and had a satisfactory piezoelectric property and stability in long-term driving similar to the piezoelectric element according to Example 2.

Example 10

Sodium niobate and barium zirconate powders were weighed such that the Na, Nb, Ba, and Zr contents were the same as those of the composition according to Example 2 in Table 2. The weighed raw powders were mixed in a ball mill for 12 hours and were calcined at a temperature in the range of 900° C. to 1000° C. to yield a calcined powder. The calcined powder was mixed with 3 parts by weight of a PVB binder. This mixed powder was formed into a green sheet having a thickness of 50 μm using a doctor blade method.

An electrically conductive paste for an internal electrode was applied to the green sheet. The electrically conductive paste was a Ni paste. Nine of the green sheets to which the electrically conductive paste had been applied were stacked and were heat-pressed.

The heat-pressed layered body was fired in a tubular furnace. The heat-pressed layered body was fired to a temperature up to 300° C. in the ambient atmosphere to remove the binder and was then held at 1200° C. for 5 hours in a reducing atmosphere ($H_2:N_2=2:98$, an oxygen concentration of $2\times10^{-6}$ Pa). During cooling to room temperature, the oxygen concentration was increased to 30 Pa at a temperature of 1000° C. or less.

The resulting sintered body was cut into a 10 mm×2.5 mm piece. The side surfaces of the piece were polished. A pair of external electrodes (a first electrode and a second electrode) for alternately connecting internal electrodes were formed by Au sputtering. Thus, a multilayered piezoelectric element as illustrated in FIG. 2B was manufactured.

The observation of the internal electrodes of the multilayered piezoelectric element showed that the electrode material Ni and piezoelectric material layers were alternately stacked on top of one another. An electric field of 30 kV/cm was applied to the multilayered piezoelectric element in an oil bath at 150° C. for 30 minutes for polarization treatment. The evaluation of the piezoelectric property of the multilayered piezoelectric element showed that the multilayered piezoelectric element had a sufficient mechanical quality factor and had a satisfactory piezoelectric property and stability in long-term driving similar to the piezoelectric element according to Example 2.

Example 11

A liquid discharge head illustrated in FIGS. 3A and 3B was manufactured using the piezoelectric element according to Example 2. An ink was discharged in response to the input of an electric signal.

Example 12

A liquid discharge apparatus illustrated in FIG. 4 was manufactured using the liquid discharge head according to Example 11. An ink was discharged onto a recording medium in response to the input of an electric signal.

Example 13

An ultrasonic motor illustrated in FIG. 6A was manufactured using the piezoelectric element according to Example 2. The motor rotated upon the application of an alternating voltage.

Example 14

An optical apparatus illustrated in FIGS. 7A and 7B was manufactured using the ultrasonic motor according to Example 13. Automatic focusing was observed upon the application of an alternating voltage.

Example 15

A dust removing device illustrated in FIGS. 9A and 9B was manufactured using the piezoelectric element according to Example 2. Satisfactory dust removing efficiency was observed upon the application of an alternating voltage after plastic beads were scattered.

Example 16

An image pickup apparatus illustrated in FIG. 12 was manufactured using the dust removing device according to Example 15. Dust on the surface of the image pickup unit was satisfactorily removed, and images free of dust defects were obtained.

Example 17

A liquid discharge head illustrated in FIGS. 3A and 3B was manufactured using the multilayered piezoelectric element according to Example 9. An ink was discharged in response to the input of an electric signal.

Example 18

A liquid discharge apparatus illustrated in FIG. 4 was manufactured using the liquid discharge head according to Example 17. An ink was discharged onto a recording medium in response to the input of an electric signal.

Example 19

An ultrasonic motor illustrated in FIG. 6A was manufactured using the multilayered piezoelectric element according to Example 9. The motor rotated upon the application of an alternating voltage.

Example 20

An optical apparatus illustrated in FIGS. 7A and 7B was manufactured using the ultrasonic motor according to Example 19. Automatic focusing was observed upon the application of an alternating voltage.

Example 21

A dust removing device illustrated in FIGS. 9A and 9B was manufactured using the multilayered piezoelectric element according to Example 9. Satisfactory dust removing efficiency was observed upon the application of an alternating voltage after plastic beads were scattered.

Example 22

An image pickup apparatus illustrated in FIG. 12 was manufactured using the dust removing device according to Example 21. Dust on the surface of the image pickup unit was satisfactorily removed, and images free of dust defects were obtained.

Example 23

An electronic device illustrated in FIG. 14 was manufactured using the multilayered piezoelectric element according to Example 9. A loudspeaker operated upon the application of an alternating voltage.

INDUSTRIAL APPLICABILITY

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-014615, filed Jan. 29, 2013, which is hereby incorporated by reference herein in its entirety.

A piezoelectric material according to an embodiment of the present invention has satisfactory piezoelectricity even at high environmental temperatures. The piezoelectric material contains no lead and can reduce the load on the environment. Thus, the lead-free piezoelectric material can be used without problems for apparatuses manufactured using a large amount of piezoelectric material, such as liquid discharge heads, liquid discharge apparatuses, ultrasonic motors, optical apparatuses, vibratory apparatuses, dust removing devices, image pickup apparatuses, and electronic equipment.

REFERENCE SIGNS LIST 1 first electrode
2 piezoelectric material
3 second electrode
101 piezoelectric element
102 individual liquid chamber
103 diaphragm
104 liquid chamber partition wall
105 discharge port
106 communicating hole
107 common liquid chamber
108 buffer layer
1011 first electrode
1012 piezoelectric material
1013 second electrode
201 oscillator
202 rotor
203 output shaft
204 oscillator
205 rotor
206 spring
2011 elastic ring
2012 piezoelectric element
2013 organic adhesive
2041 metal elastic body 2042 multilayered piezoelectric element
310 dust removing device
320 diaphragm
330 piezoelectric element
331 piezoelectric material
332 first electrode
333 second electrode
336 first electrode surface
337 second electrode surface
51 first electrode
53 second electrode
54 piezoelectric material layer
55 internal electrode
56 layered body
501 first electrode
503 second electrode
504 piezoelectric material layer
505a internal electrode
505b internal electrode
506a external electrode
506b external electrode
601 main body of camera
602 mount
605 mirror box
606 main mirror
200 shutter unit
300 main body chassis
400 image pickup unit
701 front lens group
702 rear lens group (focus lens)
711 removable mount
712 fixed barrel
713 linear guide barrel
714 front lens group barrel
715 cam ring
716 rear lens group barrel
717 cam roller
718 screw
719 roller
720 rotation transmitting ring
722 driven roller
724 manual focus ring
725 ultrasonic motor
726 wave washer
727 ball race
728 focus key
729 joint
732 washer
733 low-friction sheet
881 liquid discharge apparatus
882 exterior
883 exterior
884 exterior
885 exterior
887 exterior
890 recovering section
891 recording portion
892 carriage
896 main body of apparatus
897 automatic feeder
898 outlet
899 conveying unit
901 optical device
908 release button
909 electronic flash unit
912 loudspeaker
914 microphone
916 fill light unit
931 main body
932 zoom lever
933 power switch

The invention claimed is:

1. A piezoelectric ceramic comprising Cu content and a perovskite-type metal oxide having the following general formula (1):

$$Na_xBa_{1-y}Nb_yZr_{1-y}O_3 \quad (1)$$

wherein x satisfies 0.85≤x≤0.96, and y satisfies 0.90≤y≤0.96, wherein the Cu content corresponds to 2.00 mol % or less of the amount of the perovskite-type metal oxide, and wherein the average equivalent circular diameter of crystal grains of the piezoelectric ceramic is 0.3 μm or more and 100 μm or less.

2. The piezoelectric ceramic according to claim 1, wherein x is smaller than y in the general formula (1).

3. The piezoelectric ceramic according to claim 1, wherein the piezoelectric ceramic has a Curie temperature of 140° C. or more.

4. A piezoelectric element, comprising: a first electrode; a piezoelectric ceramic portion; and a second electrode, wherein the piezoelectric ceramic portion includes the piezoelectric ceramic according to claim 1.

5. A multilayered piezoelectric element, comprising: piezoelectric ceramic layers and electrode layers alternately stacked on top of one another, the electrode layers including an internal electrode, wherein the piezoelectric ceramic layers contain the piezoelectric ceramic according to claim 1.

6. The multilayered piezoelectric element according to claim 5, wherein the internal electrode contains Ag and Pd, and the weight ratio M1/M2 of the weight M1 of Ag to the weight M2 of Pd is in the range of 1.5≤M1/M2≤9.0.

7. The multilayered piezoelectric element according to claim 5, wherein the internal electrode contains at least one of Ni and Cu.

8. A liquid discharge head, comprising: a liquid chamber; and a discharge port in communication with the liquid chamber, wherein the liquid chamber includes a vibrating portion that includes the piezoelectric element according to claim 4.

9. A liquid discharge apparatus, comprising: a stage configured to receive an object; and the liquid discharge head according to claim 8.

10. An ultrasonic motor, comprising: a vibrating member that includes the piezoelectric element according to claim 4; and a moving body in contact with the vibrating member.

11. An optical apparatus, comprising a drive unit that includes the ultrasonic motor according to claim 10.

12. A vibratory apparatus, comprising a vibrating member that includes the piezoelectric element according to claim 4 on a diaphragm.

13. A dust removing device, comprising a vibrating portion including the vibratory apparatus according to claim 12.

14. An image pickup apparatus, comprising: the dust removing device according to claim 13; and an image pickup element unit, wherein the diaphragm of the dust removing device is disposed on the light-receiving surface side of the image pickup element unit.

15. Electronic equipment, comprising the piezoelectric element according to claim 4.

16. A liquid discharge head, comprising: a liquid chamber; and a discharge port in communication with the liquid chamber, wherein the liquid chamber includes a vibrating portion that includes the multilayered piezoelectric element according to claim 5.

17. A liquid discharge apparatus, comprising: a stage configured to receive an object; and the liquid discharge head according to claim 16.

18. An ultrasonic motor, comprising: a vibrating member that includes the multilayered piezoelectric element according to claim 5; and a moving body in contact with the vibrating member.

19. An optical apparatus, comprising a drive unit that includes the ultrasonic motor according to claim 18.

20. A vibratory apparatus, comprising a vibrating member that includes the multilayered piezoelectric element according to claim 5 on a diaphragm.

21. A dust removing device, comprising a vibrating portion including the vibratory apparatus according to claim 20.

22. An image pickup apparatus, comprising: the dust removing device according to claim 21; and an image pickup element unit, wherein the diaphragm of the dust removing device is disposed on the light-receiving surface side of the image pickup element unit.

23. Electronic equipment, comprising the multilayered piezoelectric element according to claim 5.

24. The piezoelectric ceramic according to claim 1, wherein x satisfies $0.88 \leq x \leq 0.96$.

25. A piezoelectric acoustic component comprising the piezoelectric element according to claim 4.

26. A piezoelectric acoustic component comprising the multilayered piezoelectric element according to claim 5.

* * * * *